United States Patent
Cho et al.

(10) Patent No.: US 9,372,560 B2
(45) Date of Patent: Jun. 21, 2016

(54) SIGNAL DETECTING SYSTEM OF MULTI WIDE CAPACITIVE TOUCH-SCREEN

(71) Applicant: iKAIST Co., Ltd., Daejeon (KR)

(72) Inventors: Gyu Hyeong Cho, Daejeon (KR); Sang Hui Park, Daejeon (KR); Gyu Ha Cho, Daejeon (KR); Chul Kweon, Daejeon (KR); Joo Yeong Yoon, Daejeon (KR); Sung Jin Kim, Daejeon (KR); Soo Hyun Park, Daejeon (KR)

(73) Assignee: IKAIST CO., LTD., Daejeon (KR)

( * ) Notice: Subject to any disclaimer, the term of this patent is extended or adjusted under 35 U.S.C. 154(b) by 0 days.

(21) Appl. No.: 13/865,706

(22) Filed: Apr. 18, 2013

(65) Prior Publication Data

US 2013/0278555 A1 Oct. 24, 2013

(30) Foreign Application Priority Data

Apr. 23, 2012 (KR) .................. 10-2012-0042094

(51) Int. Cl.
G06F 3/041 (2006.01)
G06F 3/044 (2006.01)

(52) U.S. Cl.
CPC ............... *G06F 3/041* (2013.01); *G06F 3/044* (2013.01); *H01L 2924/0002* (2013.01)

(58) Field of Classification Search
CPC ....... G06F 3/041; G06F 3/044; H01L 2924/00; H01L 2924/0002
See application file for complete search history.

(56) References Cited

U.S. PATENT DOCUMENTS

| | | | |
|---|---|---|---|
| 6,987,509 B1 * | 1/2006 | Haas ........................... 345/208 |
| 2003/0137351 A1 * | 7/2003 | Renous et al. .............. 330/260 |
| 2010/0259505 A1 * | 10/2010 | Chang ......................... 345/174 |
| 2010/0327889 A1 * | 12/2010 | Matsubara ................... 324/705 |
| 2010/0328265 A1 * | 12/2010 | Hotelling et al. ........... 345/174 |
| 2011/0227864 A1 * | 9/2011 | Baek ........................... 345/174 |
| 2012/0086656 A1 * | 4/2012 | Hung et al. .................. 345/173 |
| 2012/0154340 A1 * | 6/2012 | Vuppu et al. ................ 345/179 |
| 2012/0169641 A1 * | 7/2012 | Wang et al. .................. 345/173 |
| 2012/0262389 A1 * | 10/2012 | Kida et al. ................... 345/173 |
| 2012/0262391 A1 * | 10/2012 | Maki et al. .................. 345/173 |
| 2012/0262410 A1 * | 10/2012 | Lim ............................. 345/174 |
| 2013/0169581 A1 * | 7/2013 | Small ........................... 345/174 |
| 2013/0278555 A1 * | 10/2013 | Cho et al. .................... 345/174 |

* cited by examiner

*Primary Examiner* — Aneeta Yodichkas
(74) *Attorney, Agent, or Firm* — Rabin & Berdo, P.C.

(57) ABSTRACT

The present invention relates to a signal detection system of a touch screen, and more particularly to a signal detection system of a large-sized mutual capacitive multi touch screen that is capable of effectively reducing RC time delay, signal distortion, an effect of noise, parasitic resistance, and parasitic capacitance.

11 Claims, 27 Drawing Sheets

SIGNAL DETECTING SYSTEM OF MULTI WIDE CAPACITIVE TOUCH-SCREEN

BACKGROUND OF THE INVENTION

1. Field of the Invention

The present invention relates to a signal detection system of a touch screen, and more particularly to a signal detection system of a large-sized mutual capacitive multi touch screen that is capable of effectively reducing RC time delay, signal distortion, an effect of noise, parasitic resistance, and parasitic capacitance.

2. Description of the Related Art

With widespread popularization in recent years, touch screens have been used in various devices, such as an automatic teller machine (ATM), a kiosk, a point of sale (POS) system, a personal digital assistant (PDA), a navigator, an MP3 player, a smart phone, and a tablet PC. The touch screens are in the spotlight in terms of providing a convenient interface. It is expected that the demand for the touch screen will continue to increase in various fields with the development of the information technology (IT) industry.

Currently commercialized touch screens generally include a resistive touch screen, a surface acoustic wave (SAW) touch screen, an infrared touch screen, an optical or camera type touch screen, and a capacitive touch screen, all of which have advantages and disadvantages.

Among the above-mentioned touch screens, the capacitive touch screen is superior to the other type touch screens in that it is possible to realize an accurate multi touch function and thus has highest percentage of the market. The capacitive touch screen is adopted in most smart phones and tablet PCs, which have been popularized in recent years.

In the capacitive touch screen, when voltage is applied to a panel and an object, such as a finger, touches the panel, the touch point is recognized based on variation of voltage due to capacitance generated between the finger and the panel. Also, the capacitive touch screen has advantages in that the capacitive touch screen exhibits higher resolution, durability, and transmittance than the other type touch screens, the capacitive touch screen is manufactured with low cost except for the resistive touch screen, and it is possible to recognize multiple touches without difficulty while being little affected by surface foreign matter or the surroundings like the infrared touch screen, the surface acoustic wave touch screen, and the optical or camera type touch screen.

As described above, the capacitive touch screen is superior to the other type touch screens in terms of several characteristics. In case of realizing a large-sized multi touch screen, however, parasitic resistance and capacitance present in a touch panel are increased with the increase in size of the touch panel with the result that RC time delay is excessively increased. For this reason, it is difficult to manufacture such a large-sized multi touch screen.

With promotion of smart education based on IT technology by Ministry of Education & Science Technology in Korea in recent years, the demand for a large-sized multi touch screen has been increased. Due to technical limitations of a capacitive touch screen, however, most large-sized multi touch screens have been manufactured as an infrared touch screen or a camera type touch screen.

In the infrared touch screen or camera type touch screen, when the number of touch points is increased, an additional algorithm is necessary to recognize the touch points. For this reason, the infrared touch screen or camera type touch screen is not considered to realize true multiple touches. In addition, the infrared touch screen or camera type touch screen has lower efficiency and accuracy than the capacitive touch screen.

Accordingly, much research and development have been conducted into a large-sized capacitive touch screen capable of correctly recognizing multiple touches and exhibiting excellent touch characteristics.

SUMMARY OF THE INVENTION

Therefore, the present invention has been made in view of the above problems, and it is an object of the present invention to provide a signal detection system of a large-sized capacitive multi touch screen wherein a wiring structure is improved to reduce RC time delay and to alleviate a signal distortion problem and wherein a signal difference value between neighboring electrodes is extracted, amplified, and accumulated to reduce an effect of noise, which is an important problem caused in a conventional touch screen.

In accordance with an aspect of the present invention, the above and other objects can be accomplished by the provision of a signal detection system of a large-sized capacitive multi touch screen to recognize a touch using coupling capacitance generated between a driving side electrode and a receiving side electrode, the signal detection system including a touch pattern unit including a plurality of driving side electrodes and a plurality of receiving side electrodes, the driving side electrodes and the receiving side electrodes being arranged in a predetermined pattern, a driving unit to sequentially apply a drive signal to each of the driving side electrodes from the outermost one of the driving side electrodes at one side to the outermost one of the driving side electrodes at the other side and to float the other driving side electrodes to which the drive signal is not applied, and a receiving unit connected to one end of each of the receiving side electrodes to extract, amplify, and output a difference value between neighboring receiving side electrodes, wherein a capacitor is connected to each of the receiving side electrodes to exhibit a floating effect. The receiving unit may include a capacitor unit connected to one end of each of the receiving side electrodes to collect charges based on a drive signal, an extraction unit to extract a signal difference value between one of the receiving side electrodes and a neighboring one of the receiving side electrodes, an amplification unit to amplify the difference value extracted by the extraction unit, an accumulation unit to accumulate, store, and output the amplified difference value, and a signal conversion unit to convert the accumulation signal output from the accumulation unit into a digital value and to output the digital value.

In accordance with another aspect of the present invention, there is provided a signal detection system of a large-sized capacitive multi touch screen to recognize a touch using coupling capacitance generated between a driving side electrode and a receiving side electrode, the signal detection system including a touch pattern unit including a plurality of driving side electrodes and a plurality of receiving side electrodes, the driving side electrodes and the receiving side electrodes being arranged in a predetermined pattern, a driving unit to simultaneously apply drive signals to two neighboring ones of the driving side electrodes from the outermost one of the driving side electrodes at one side to the outermost one of the driving side electrodes at the other side such that time difference is generated between pulses input to both the driving side electrodes and to float the other driving side electrodes to which the drive signals are not applied, and a receiving unit connected to one end of each of the receiving side electrodes to extract, amplify, and output a difference value between neighboring ones of the receiving side electrodes, wherein the difference value is obtained by subtraction between difference values for the two driving side electrodes to which the drive signals are applied, and a capacitor is connected to each of the receiving side electrodes to exhibit a floating effect.

The driving unit may be configured to ground driving side electrodes adjacent to the driving side electrodes to which the drive signals are applied and to float the other driving side electrodes excluding the driving side electrodes to which the drive signals are applied or the grounded driving side electrodes.

The receiving unit may include a capacitor unit connected to one end of each of the receiving side electrodes to collect charges based on a drive signal, an extraction unit to extract a signal difference value between one of the receiving side electrodes and a neighboring one of the receiving side electrodes, an amplification unit to amplify the difference value extracted by the extraction unit, an offset correction unit to store the amplified difference value for a drive signal of one of the driving side electrodes and to subtract the stored difference value from the amplified difference value for a drive signal of another of the driving side electrodes, an accumulation unit to accumulate, store, and output the value output from the offset correction unit, and a signal conversion unit to convert the accumulation signal output from the accumulation unit into a digital value and to output the digital value.

In the signal detection system according to the above aspects of the present invention, the driving unit may be configured to simultaneously apply a drive signal to opposite ends of a corresponding one of the driving side electrodes.

Also, neighboring ones of the receiving side electrodes may be combined into a group such that the receiving side electrodes are arranged in groups.

Also, the capacitor unit and the extraction unit may be configured to have a Miller capacitor structure.

Also, the receiving unit may further include a reset unit to reset each of the receiving side electrodes.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Figure 1:
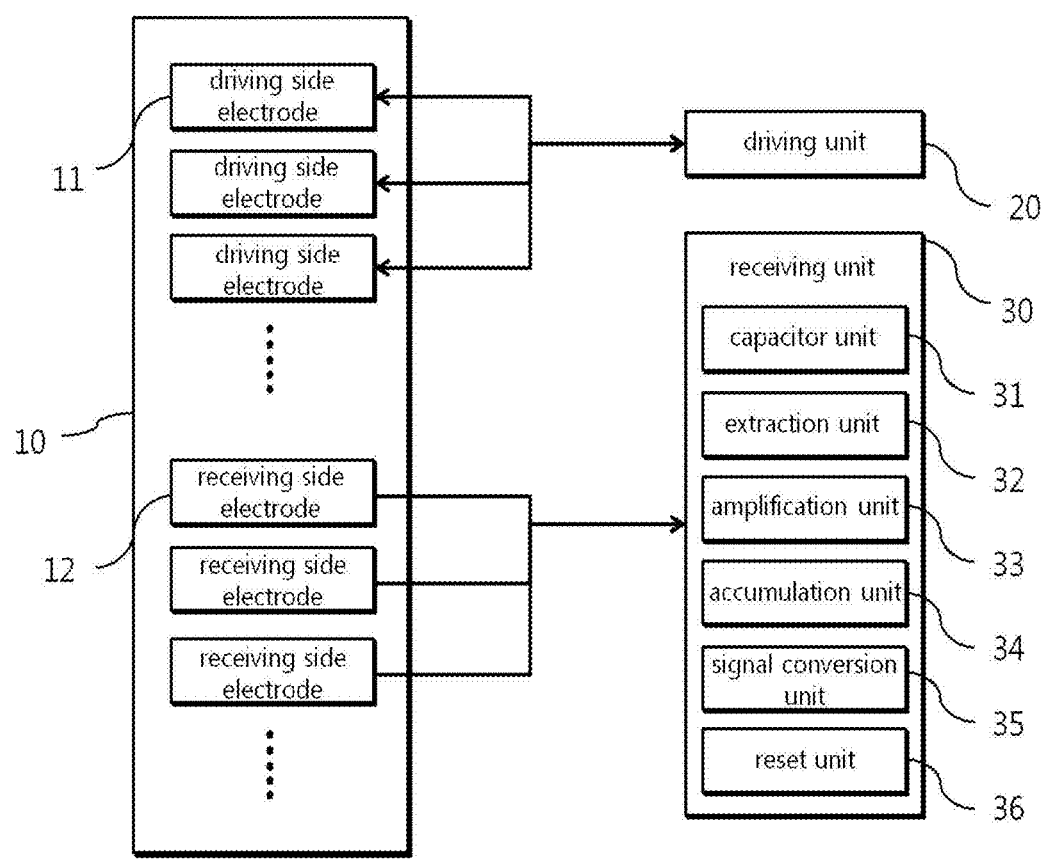
FIG. 1 is a block diagram showing the construction of a signal detection system of a large-sized capacitive multi touch screen according to a first embodiment of the present invention.

Now, the construction of a signal detection system of a large-sized capacitive multi touch screen according to the present invention will be described in detail with reference to the accompanying drawings.

Based on touch detection methods, a capacitive touch screen is classified as a self capacitive touch screen or a mutual capacitive touch screen. The present invention is applied to the latter case, i.e. the mutual capacitive touch screen.

The self capacitive touch screen and the mutual capacitive touch screen will be described in brief. In the self capacitive touch screen, when a finger touches a touch panel, additional capacitance is generated between the finger and the touch panel, and a signal is detected based on variation of voltage applied to the touch panel corresponding to the additional capacitance. In the self capacitive touch screen, however, if two or more points are touched, a ghost point is generated with the result that it is not possible to properly recognize the touch points.

In the mutual capacitive touch screen used in the present invention, on the other hand, a plurality of driving side electrodes to apply a signal to a touch pattern unit (10) and a plurality of receiving side electrodes to receive the signal are arranged in a predetermined pattern, and a signal is detected using coupling capacitance generated between one of the driving side electrodes (11) and a corresponding one of the receiving side electrodes (12) on a touch point. Specifically, when a certain point is touched, an electric field between one driving side electrode (11) and a corresponding receiving side electrode (12) is changed to reduce coupling capacitance between the two electrodes, which changes a voltage signal transmitted to a receiving unit (30), whereby it is possible to recognize the touch point. This mutual capacitive touch screen has an advantage in that it is possible to theoretically realize multiple touches without limitations in number of touch points.

FIG. 1 is a block diagram showing the construction of a signal detection system of a large-sized capacitive multi touch screen according to a first embodiment of the present invention. As shown in FIG. 1, the signal detection system mainly includes a touch pattern unit (10), a driving unit (20), and a receiving unit (30).

The touch pattern unit (10) includes a plurality of driving side electrodes (11) and a plurality of receiving side electrodes (12), which form a predetermined pattern as previously described. The driving side electrodes (11) and the receiving side electrodes (12) may form various patterns. Different patterns generate different coupling capacitances.

Various patterns of the touch pattern unit have been developed and commercialized. Typically, the patterns of the touch pattern unit are classified into a diamond pattern, a bar pattern, a snowflake pattern, and a grid pattern based on the shape of each electrode. The patterns of the touch pattern unit have a close relation with touch sensitivity of the touch pattern unit. Most commercialized patterns of the touch pattern unit are patented. In the present invention, the pattern of the touch pattern unit (10) is not limited to any specific one. Also, in this embodiment of the present invention, a bar pattern, which is generally used and in which the driving side electrodes (11) are at right angles to the receiving side electrodes (12) with predetermined intervals therebetween, is applied to the touch pattern unit (10).

Figure 2:
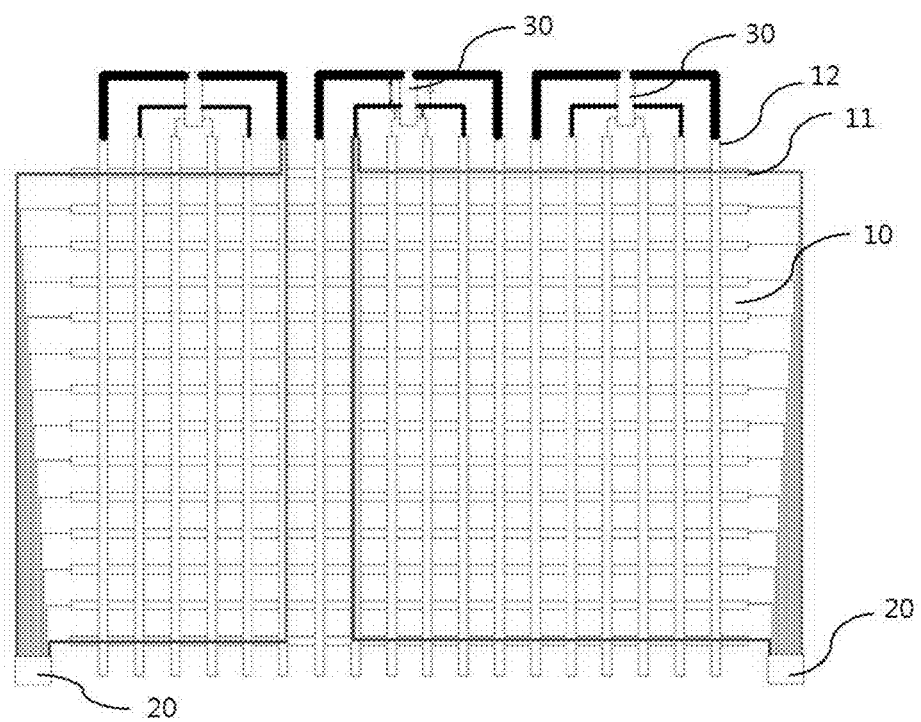
FIG. 2 is a view showing a wiring structure of a touch pattern unit of the present invention.
Figure 3:
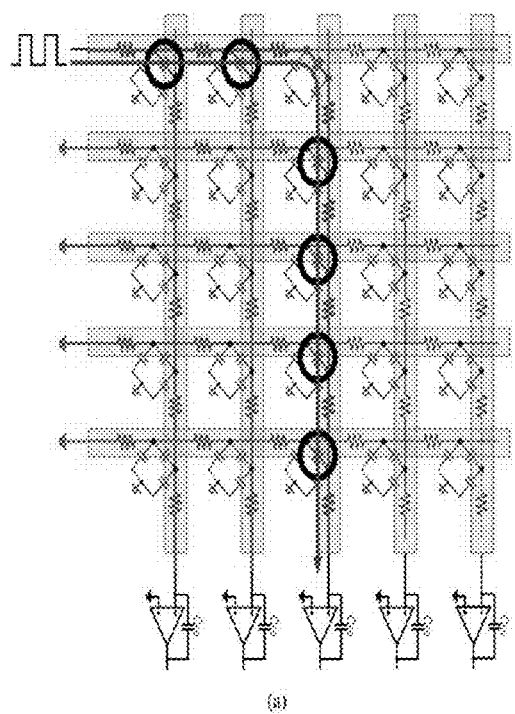
FIG. 3 is a circuit diagram showing the comparison of a signal flow between a conventional touch pattern unit and the touch pattern unit of the present invention.
Figure 3:
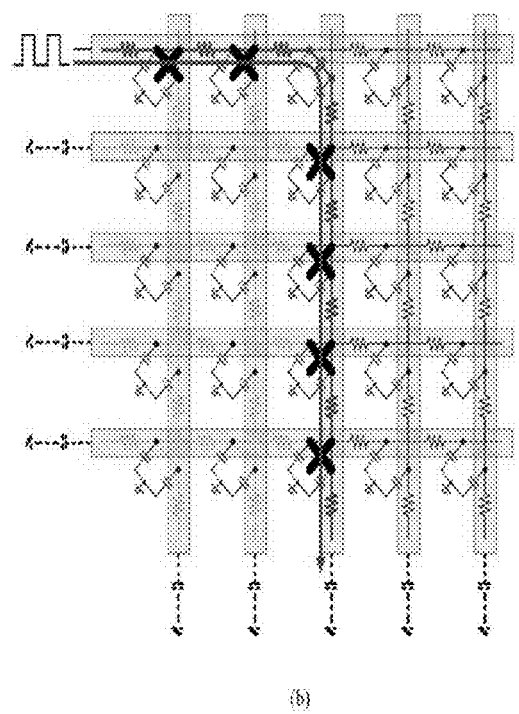
Figure 4:
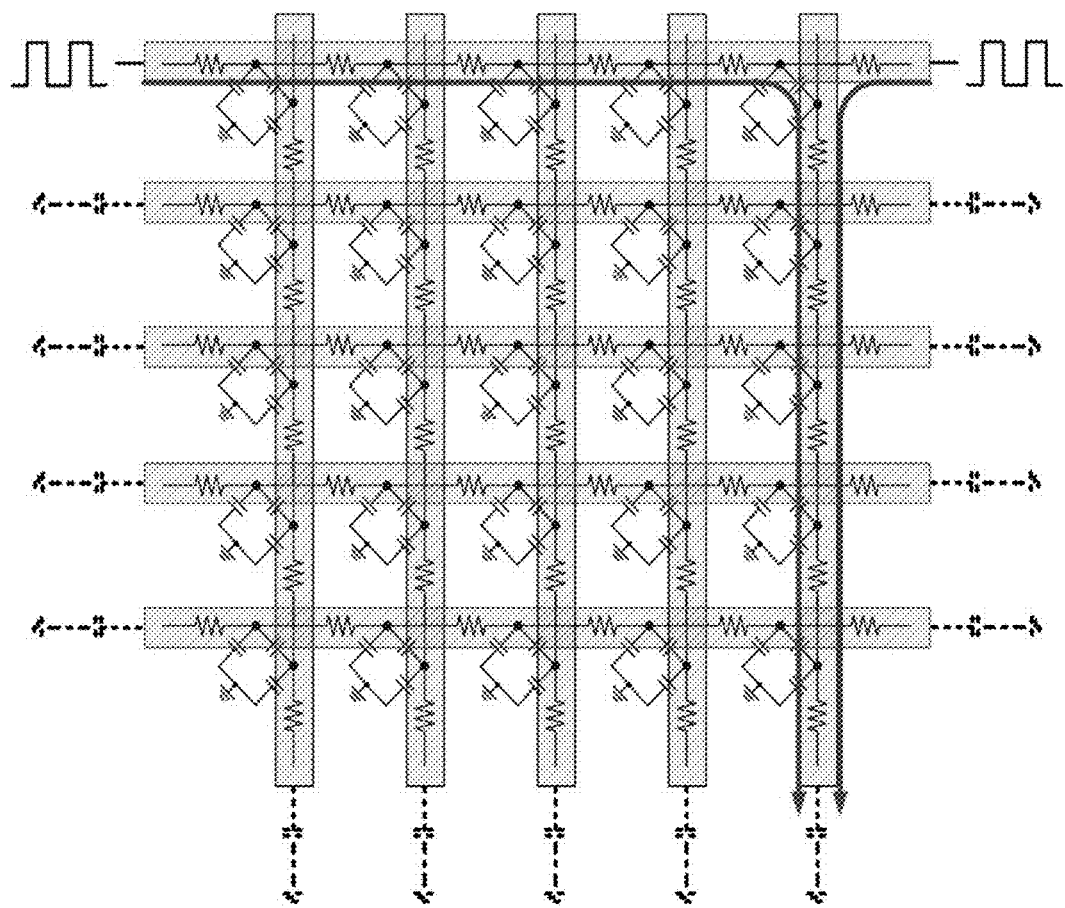
FIG. 4 is a circuit diagram showing a state in which a drive signal is applied to opposite ends of a driving side electrode.

FIG. 2 is a view showing a wiring structure of the touch pattern unit of the present invention, FIG. 3 is a circuit diagram showing the comparison of a signal flow between a conventional touch pattern unit and the touch pattern unit of the present invention, and FIG. 4 is a circuit diagram showing a state in which a drive signal is applied to opposite ends of one of the driving side electrodes. The driving side electrodes (11) are arranged in the horizontal direction, and the receiving side electrodes (12) are arranged in the vertical direction.

As shown in FIGS. 3 and 4, coupling capacitances are respectively arranged between the driving side electrodes (11) and the receiving side electrodes (12) at predetermined intervals. When a specific point is touched, the coupling capacitance at the point is decreased.

The driving unit (20) sequentially applies a drive signal to each of the driving side electrodes (11) from the outermost one of the driving side electrodes (11) at one side to the outermost one of the driving side electrodes (11) at the other side. At this time, a method of applying a drive signal to only one end of a corresponding driving side electrode (11) is not used. In the present invention, a method of simultaneously applying a drive signal to opposite ends of a corresponding driving side electrode (11) and floating the other driving side electrodes (11), to which the drive signal is not applied, is used. In the latter method, the driving unit (20) serves as a capacitor to float the driving side electrodes (11) when no drive signal is applied.

In the present invention, a drive signal is simultaneously applied to opposite ends of a corresponding driving side electrode (11) to reduce both capacitance and resistance, which are increased as the result of the increase in size of the touch pattern unit (10). In a case in which a drive signal is simultaneously applied to opposite ends of a corresponding driving side electrode (11), the length of a signal flow route is reduced, which means that parasitic resistance and parasitic capacitance in the signal flow route are decreased. That is, as show in FIG. 4, a touch point located distant when viewed from one end of the driving side electrode (11) is located nearby when viewed from the other end of the driving side electrode (11) with the result that the length of a drive signal flow route is reduced, whereby parasitic resistance and parasitic capacitance in the signal flow route are decreased. Also, in a case in which a drive signal is simultaneously applied to opposite ends of a driving side electrode (11), an effect that the drive signal (or charge) is strongly applied from the opposite ends of the driving side electrode (11) is obtained in addition to the above effect. As a result, RC time delay is greatly reduced.

Figure 5:
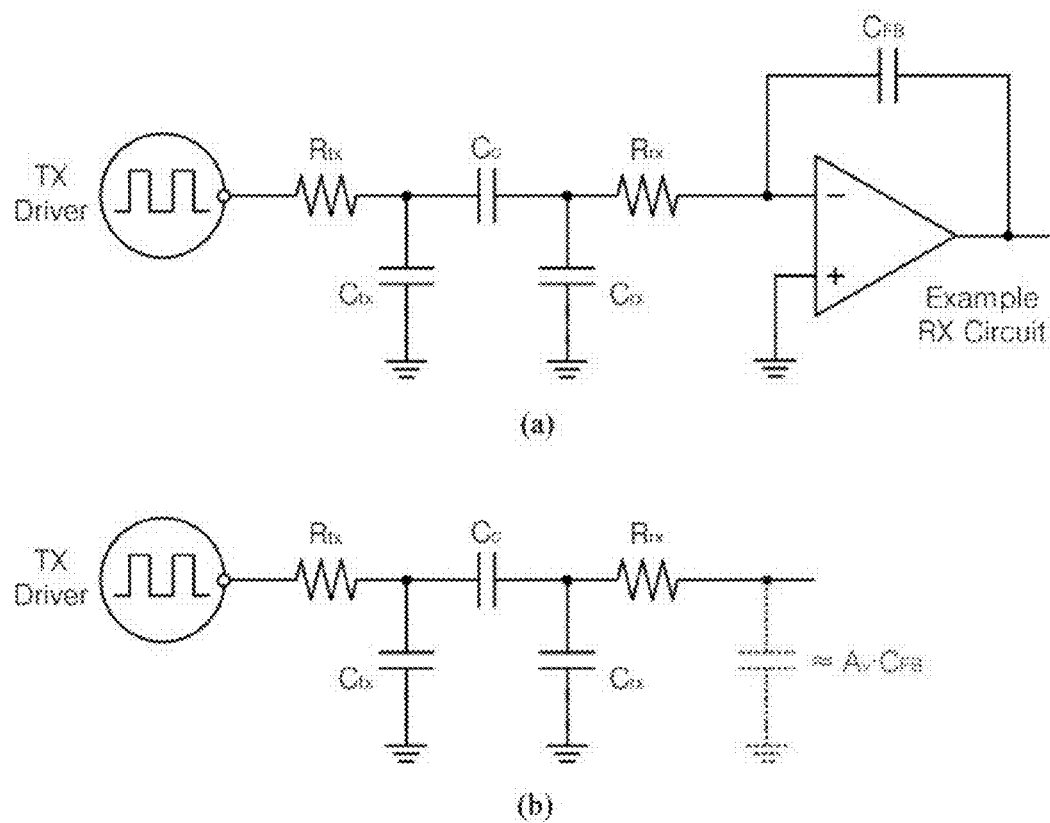
FIG. 5 is a view illustrating a Miller effect of a charge amplifier structure.

Also, in a conventional capacitive touch screen, a receiving side electrode (12) is connected to an input terminal of an operation amplifier. The operation amplifier is used to relatively reduce an effect of parasitic capacitance through a Miller effect. FIG. 5 is a view illustrating a Miller effect of a charge amplifier structure. It can be seen from FIG. 5 that capacitance $C_{FB}$ is increased to an extent of an amplification rate of the operation amplifier as the result of a Miller effect, whereby an effect of parasitic capacitance $C_{rx}$ is greatly reduced.

In a case in which, in connection with the amplitude of a signal, the capacitance $C_{FB}$ is amplified to be considerably higher than the parasitic capacitance $C_{rx}$, whereby an effect of parasitic capacitance $C_{rx}$ is greatly reduced as described above. In a case in which the operation amplifier is used in a receiving circuit, however, a node connected to the operation amplifier has low impedance, which means that coupling capacitance of the pattern is formed as parasitic capacitance in the signal flow route.

Also, in the conventional capacitive touch screen, the driving unit connects the other driving side electrodes excluding a driving side electrode transmitting a drive signal to specific voltage or grounds the other driving side electrodes, which also mean that other coupling capacitances are formed as parasitic capacitances in the signal flow route.

In conclusion, coupling capacitances in a signal flow route substantially serve as parasitic capacitances due to a low impedance node caused by an operation amplifier in a receiving circuit and a low impedance node of a driving circuit, which is shown in FIG. 3(a).

The formation of such parasitic capacitances induces greater RC time delay, and the Miller effect of the operation amplifier does not play an important part in reducing such RC time delay. At this time, when a receiving side electrode is connected to an input node of the operation amplifier, and the other driving side electrodes, to which a drive signal is not applied, are not connected to specific voltage or the ground as in the conventional method but are floated, parasitic capacitance due to other coupling capacitances in the signal flow route is hardly formed, and therefore, RC time delay is greatly reduced, which is shown in FIG. 3(b).

In order for the driving unit (20) of the present invention, which floats the other driving side electrodes, to which a drive signal is not applied, and applies a drive signal to opposite ends of one of the driving side electrodes (11) so as to reduce RC time delay, to be properly applied to realization of a large-sized multi touch screen, a sensing system suitable for the structure of the driving unit (20) is necessary, which is provided by the receiving unit (30).

In the present invention, neighboring receiving side electrodes (12) may be combined into a group such that the receiving side electrodes (12) are arranged in groups as shown in FIG. 2. Referring to FIG. 2, six receiving side electrodes are combined into a group, to which a receiving unit is connected.

Before describing the wiring structure of the present invention, how the amplitude of resistance and coupling capacitance are formed will be described. First, the amplitude of resistance is in proportion to the length of a wire and in inverse proportion to the thickness and width of the wire as expressed by the following equation.

$$R = \rho \frac{L}{w \cdot h( = A)}$$

Where, p indicates specific resistance, L indicates the length of a wire, w indicates the width of the wire, and h indicates the thickness of the wire.

Next, on the assumption that a wire is formed in the shape of a general cylinder, coupling capacitance between wires is in proportion to the length of each wire and in inverse proportion to the distance between the wires as expressed by the following equation.

$$C = \frac{2\pi\varepsilon L}{\ln\left[\frac{h + \sqrt{h^2 - r^2}}{r}\right]}$$

Where, L indicates the length of each wire, h indicates the distance between wires, and r indicates a radius of each wire.

A proposed outer wiring structure considering resistive and capacitive components of the wires is shown in FIG. 2. A bar pattern is shown as the touch pattern, but the proposed wiring structure is applicable irrespective of patterns.

The present invention focuses on maximum coincidence of parasitic resistances present in a signal flow route and maximum coincidence of coupling capacitances between signals to narrow RC time delay distribution of the signals and to reduce distortion of the signals. For maximum coincidence of such parasitic resistances, the receiving side electrodes (12) are combined into several groups.

In a case in which neighboring receiving side electrodes (12) are combined into a group, as shown in FIG. 4, there is little difference in length between the minimum route and the maximum route, and therefore, there is also little difference between resistance values. Also, in each receiving side electrode group, a longer wire may be thickened and a shorter wire may be thinned to further reduce the difference between resistance values.

Also, for maximum coincidence of parasitic capacitances, the distance between the wires is gradually increased in each receiving side electrode group since the facing length between two wires is gradually increased toward the outer side thereof. Such a structure in which the distance between the wires is gradually increased may be equally applied to the driving side electrodes (11).

Finally, the driving side electrode groups are connected in the opposite direction of the receiving side electrode group. A structure in which the receiving side electrodes (12) are connected at the upper side and the driving side electrodes (11) are connected at the lower side is shown in FIG. 2. In this structure, the lengths of signal flow routes almost coincide with each other irrespective of the position of the driving side electrodes (11), thereby achieving maximum coincidence of parasitic resistances in the signal flow route.

Also, the receiving unit (30) is connected to one end of each receiving side electrode (12) to extract, amplify, and output a difference value between neighboring receiving side electrodes. A capacitor is connected to each receiving side electrode such that the receiving side electrodes are floated, which reduces RC time delay in the same manner as in the case in which the driving side electrodes, to which a drive signal is not applied, are floated as previously described. That is, a floating effect is achieved through the operation of the capacitors, not complete cutting of a circuit.

Specifically, the receiving unit (30) includes a capacitor unit (31) connected to one end of each receiving side electrode (12) to collect charges based on a drive signal, an extraction unit 32 to extract a signal difference value between one of the receiving side electrodes and a neighboring one of the receiving side electrodes, an amplification unit (33) to amplify the difference value extracted by the extraction unit (32), an accumulation unit (34) to accumulate, store, and output the amplified difference value, and a signal conversion unit (35) to convert the accumulation signal output from the accumulation unit (34) into a digital value and to output the digital value.

The capacitor unit (31) includes a small-sized capacitor connected to one end of each receiving side electrode (12) such that the receiving side electrodes (12) are floated. When a drive signal is applied to one of the driving side electrodes (11), a signal corresponding thereto appears at the capacitor unit (31) connected to the receiving side electrodes (12).

Also, in the present invention, corresponding signals of all of the connected receiving side electrodes (12) are simultaneously processed based on one of the driving side electrodes (11), to which a drive signal is applied, in order to reduce response time of the touch screen. If only an output value of a receiving side electrode is processed based on a drive signal, much time is taken to fully scan the touch pattern unit (10). For this reason, it is necessary to simultaneously process corresponding signals of all receiving side electrodes (12) for realization of a large-sized touch screen.

When a corresponding signal based on application of the drive signal is output to the capacitor unit (31) connected to the receiving side electrodes (12), the extraction unit (32) compares the signal with a corresponding signal of a neighboring receiving side electrode and extracts the difference therebetween. Comparison between signals of neighboring receiving side electrodes is performed to reduce an effect of common noise which is wholly or locally generated. That is, when noise is generated, the noise appears at two neighboring electrodes in similar forms. In order to offset an effect of such noise, therefore, the signal difference value between the two neighboring electrodes is extracted.

The difference value between the neighboring corresponding signals extracted by the extraction unit (32) is relatively small. For this reason, the difference value between the neighboring corresponding signals is amplified by the amplification unit (33). The amplified difference value is accumulated in the accumulation unit (34) through repetitive application of drive signals to increase a signal to noise ratio (SNR) of the amplified difference value and to moving average noise in consideration of noise which may remain.

The accumulated and output difference value is an analog signal. Finally, therefore, the signal conversion unit (35) converts the difference value into a digital value for digital processing. Afterwards, the converted value is digitally processed to read the position of a touch point.

Figure 6:
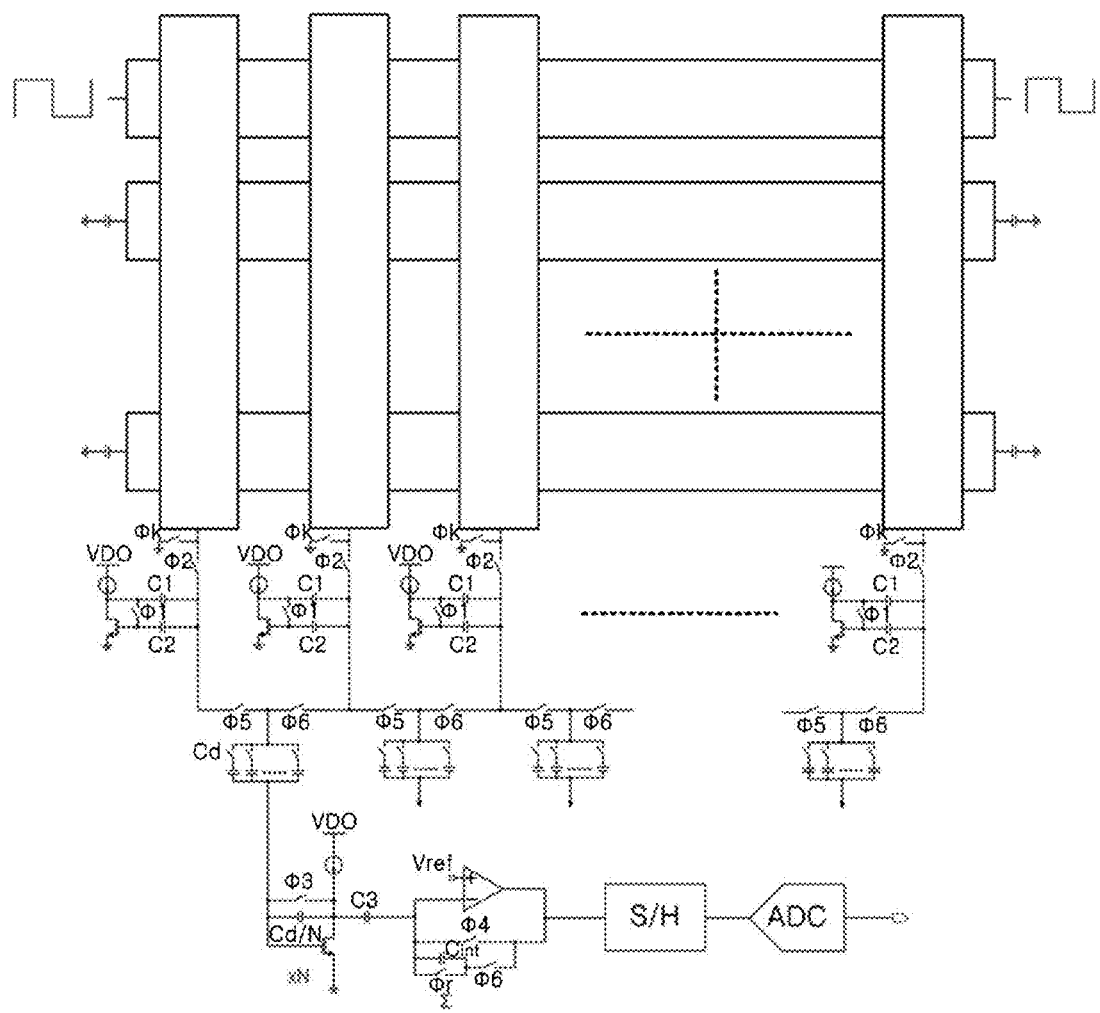
FIG. 6 is a circuit diagram showing a receiving unit according to a first embodiment of the present invention.

FIG. 6 is a circuit diagram showing a receiving unit according to a first embodiment of the present invention. This circuit is generally operated as previously described. That is, when driving voltage is applied to the driving side electrodes (11), corresponding voltage appears at the capacitor unit (31) connected to the receiving side electrodes (12), corresponding voltages of two neighboring lines are compared to extract a difference value therebetween, the extracted difference value is amplified, the amplified difference value is accumulated and stored, the accumulated and stored difference value is transmitted to the signal conversion unit, which may be an analog to digital (A/D) converter (ADC), and the signal conversion unit converts the accumulated analog value into a digital value.

Figure 7:
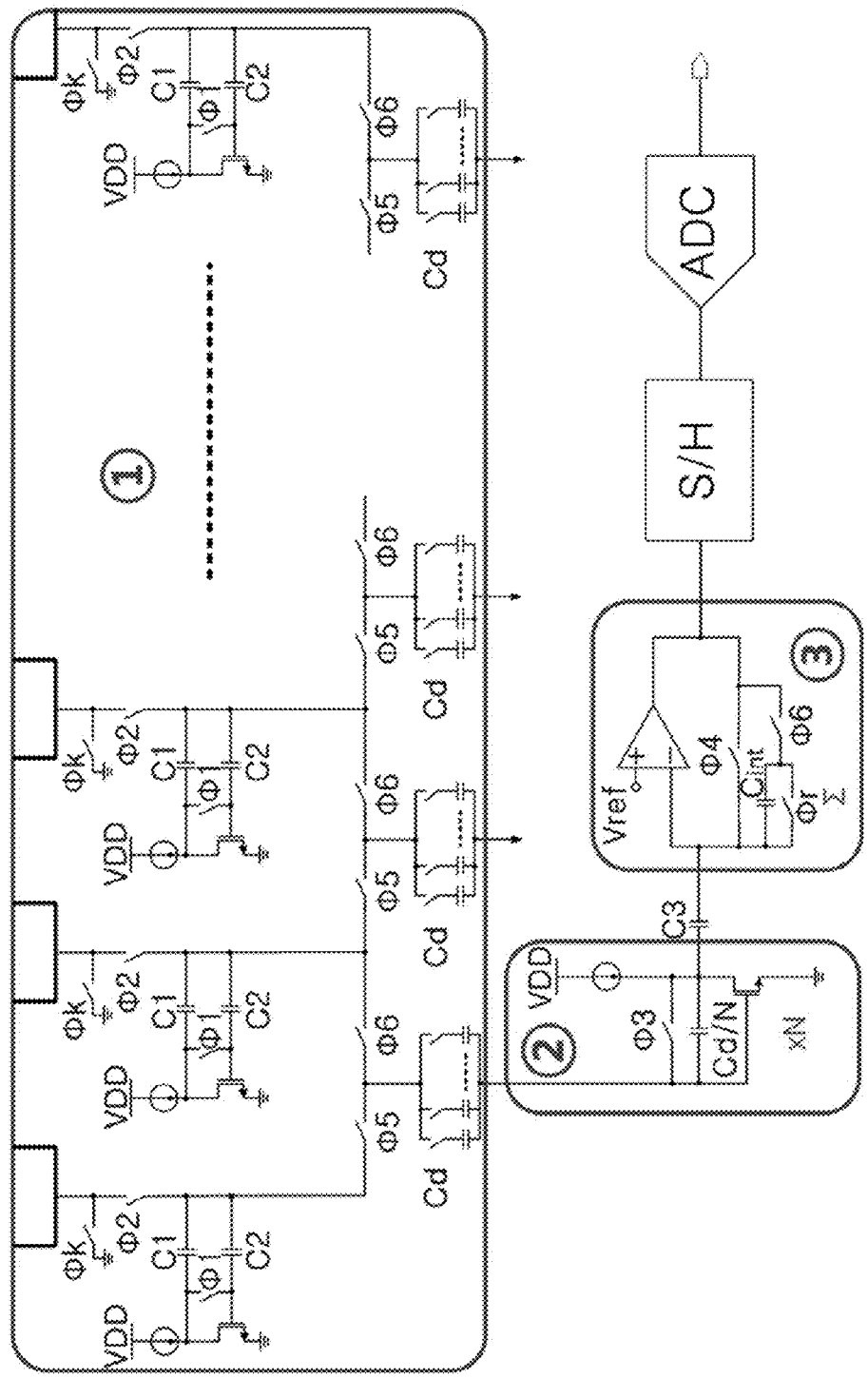
FIG. 7 is a circuit diagram showing the circuit of FIG. 6 in a divided and enlarged state.

FIG. 7 is a circuit diagram showing the circuit of FIG. 6 in a divided and enlarged state. Hereinafter, a first block, a second block, and a third block, each of which is enclosed in a solid bold line, will be individually described.

The first block of FIG. 7 includes the capacitor unit and the extraction unit (32). The first block is directly connected to the receiving side electrodes (12). A voltage value corresponding to a drive signal appears at the capacitor of the first block. Also, a difference value between two neighboring receiving side electrodes is extracted through on/off of a Φ6 switch.

The second block includes the amplification unit (33) to amplify the extracted difference value n times. The third block includes the accumulation unit (34) to accumulate the amplified difference value. The respective blocks are operated as follows.

First, Φ2 and Φ5 switches are turned on before drive signals transition from low to high such that drive signals (charges), which are generated by such transition, are accumulated in capacitors C1, C2, and Cd.

At this time, it is necessary for one end of each capacitor to have low impedance such that the generated charges are accumulated in the capacitors. To this end, Φ1 and Φ3 switches are also turned on. Also, it is necessary not to introduce the charges into an integration capacitor Cint of the third block during this process. To this end, Φ4 and Φ4 switches are turned on, and the Φ6 switch is turned off.

After the charges generated by low to high transition of the drive signal are sufficiently accumulated in the capacitors C1, C2, and Cd, the Φ2 switch is turned off. At this time, the Φ1 switch is also turned off. That is, the Φ1 and Φ2 switches are simultaneously turned off. Although the Φ1 and Φ2 switches are simultaneously turned off in the present invention, the switching sequence of the Φ1 switch and the Φ2 switch may be properly adjusted as follows if necessary.

First, the Φ1 switch is turned off, and then the Φ2 switch is turned off. This is a switching sequence to reduce an effect of charge injection which may be generated when the Φ1 switch is turned off. In a case in which a charge injection problem caused by the Φ1 switch is serious, this switching operation is necessary.

Next, the Φ2 switch is turned off, and then the Φ1 switch is slowly turned off. This is a switching sequence to prevent an N-metal oxide semiconductor field effect transistor (N-MOSFET) from escaping from a saturation region due to introduction of noise and to reduce an effect of charge injection caused by the Φ1 switch. This switching operation, i.e. sequentially turning off of the Φ2 switch and the Φ1 switch, also solves a problem which may be caused when there is bandwidth difference between a Miller capacitor structure and the second block structure of FIG. 7.

As shown in the first block, the capacitor unit (31) and the extraction unit (32) are configured to have a Miller capacitor structure including two capacitors, a switch, an N-MOSFET, and a current source. That is, a structure including two capacitors (C1 and C2), a switch Φ1, an N-MOSFET, and a current source is shown in the first block of FIG. 7.

As previously described, the first block is configured to have a structure to accumulate charges generated by a drive signal. The first block of FIG. 7 is provided to obtain a Miller effect of capacitance instead of providing a single capacitor. This structure to obtain the Miller effect of capacitance is one of the core technologies of the present invention.

That is, when comparing with voltage accumulated in the Cd capacitor through this structure, the size of the Cd capacitor is negligibly small as compared with that of the Miller capacitor (C1). As a result, voltage of the Cd capacitor is changed into that of the Miller capacitor C1 of this structure, and therefore, it is possible to accurately extract a difference value between the two voltages. On the other hand, if only a signal capacitor is used without the provision of such a Miller capacitor structure, specific voltage between two voltage values configures that of the Cd capacitor during voltage comparison with the result that it is not possible to accurately extract a difference value between the two voltages.

Also, it is necessary to greatly increase the size of the capacitor in order to accurately extract a difference value using a single capacitor. In a case in which the Miller capacitor structure is adopted, on the other hand, it is possible to relatively accurately extract a voltage difference value between neighboring receiving side electrodes using a small-sized capacitor.

In addition, the Miller capacitor structure has another advantage in that a charge injection problem caused when the Φ5 switch is turned off is almost negligible. That is, such a charge injection problem is caused in a structure in which a switch and a capacitor coexist. In a case in which the Miller capacitor structure is used, on the other hand, charge injection is generated as the when the Φ5 switch is turned off but change due to the charge injection is negligible.

However, the following essential conditions to achieve effects are imposed upon the Miller capacitor structure having the above-mentioned advantages. That is, it is necessary for the N-MOSFET to be in a saturation region. In order to satisfy this condition, it is necessary to simultaneously turn off the Φ1 switch and the switch as previously described. If the Φ1 switch is turned off earlier than the Φ2 switch, noise may be introduced into the receiving unit from the touch pattern unit, and gate voltage of the N-MOSFET may be fluctuated by the noise with the result that the N-MOSFET may escape from the saturation region. In order to prevent this phenomenon, therefore, it is necessary to simultaneously turn off the Φ1 switch and the Φ2 switch.

After the Φ1 switch and the Φ2 switch are turned off, a voltage difference value between neighboring receiving side electrodes is extracted, the extracted voltage difference value is amplified, and the amplified voltage difference value is transmitted to the integration capacitor Cint. To this end, the Φ3 switch is turned off, and then the Φ4 switch is turned off after a predetermined time interval.

The switches are sequentially turned off as described above to prevent charge injection caused when the Φ3 switch is turned off from being transferred to the output side. That is, only when the Φ4 switch is on at the moment the Φ3 switch is turned off, it is possible for a capacitor C3 located between the second block and the third block to block charge injection caused when the Φ3 switch is turned off.

After the Φ3 switch and the Φ4 switch are sequentially turned off, the Φ5 switch is turned off, and then the Φ6 switch is turned on. As a result, two voltages between neighboring receiving side electrodes are compared to extract a voltage difference value, the extracted voltage difference value is amplified n times by the second block, and the amplified voltage difference value is transmitted to the third block.

In order to amplify the voltage difference value n times, the size of the capacitor of the second block is set to Cd/N, where the difference between the two voltages is amplified n times through capacitive division. Also, charge injection caused when the 5 switch is turned off may be almost negligible due to the Miller capacitor structure as previously described. A series of the above processes is continuously repeated. As a result, an amplified value of a voltage difference value between neighboring receiving side electrodes is accumulated in the integration capacitor Cint of the third block.

Figure 8:
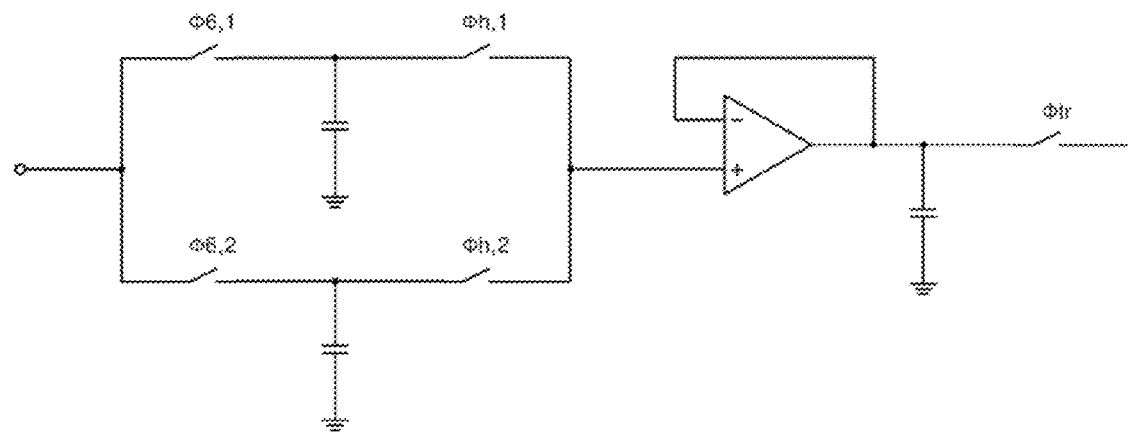
FIG. 8 is a circuit diagram showing a concept of an accumulation unit.

FIG. 8 is a circuit diagram showing a concept of the accumulation unit. The accumulation unit (34) is a circuit to remember a certain signal (voltage) and to hold the remembered signal until the next signal to be remembered is input, i.e. a sample and hold (S/H) circuit, which is denoted by S/H in the drawing.

The S/H includes two branches and a capacitor, which are provided to an accumulated voltage value corresponding to a driving side electrode is sampled and, at the same time, to transmit an accumulated voltage value corresponding to the preceding driving side electrode to the signal conversion unit (35) while holding the accumulated voltage value corresponding to the preceding driving side electrode. That is, sampling of the voltage value and transmission of the voltage value to the signal conversion unit are simultaneously performed to reduce full scanning time of the touch pattern unit.

A Φ6,1 switch and a Φ6,2 switch of S/H are switches which are turned on/off simultaneously with the Φ6 switch of the third block. When one switch is repeatedly turned on/off, the other switch remains off such that an accumulated value for one driving side electrode is sampled only in one capacitor. Also, a Φh switch provided in one capacitor branch which repeatedly performs sampling is turned off, and another Φh switch provided in the other capacitor branch is turned on such that a held voltage value in the capacitor branch is transmitted to the signal conversion unit (35) (a voltage value is output to a capacitor disposed at the rear of a buffer).

Subsequently, the held voltage value is transmitted to the signal conversion unit (ADC) by a Φtr switch.

Finally, a Φk switch located at the upper side of the first block is a switch to rapidly reset the receiving side electrodes and, at the same time, a reset unit (36) functioning to prevent the generation of inverse charges due to high to low transition of a drive signal.

The generation of charges in the opposite direction causes difference in the opposite symbol during extraction of a voltage difference value. Consequently, the reset unit 36 prevents the generation of charges in the opposite direction.

Figure 9:
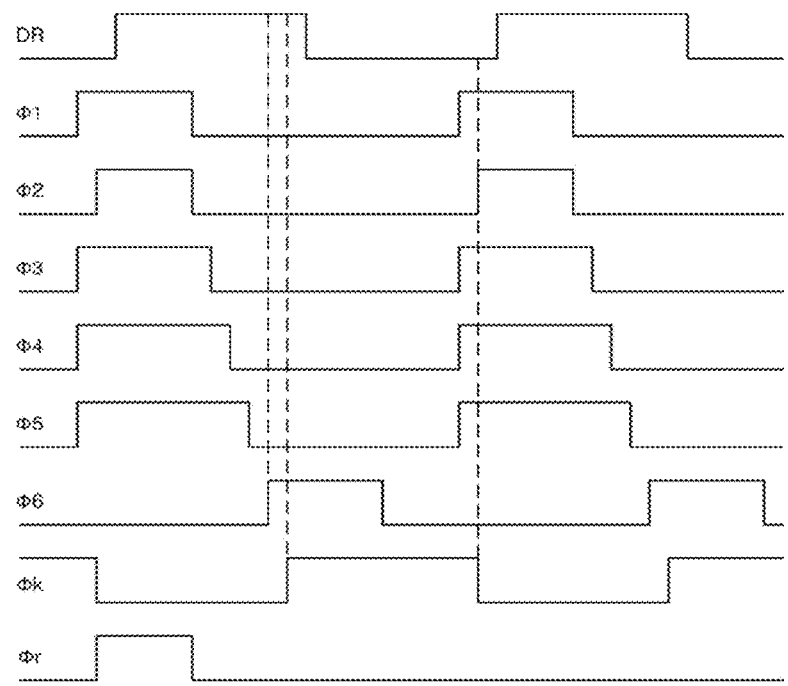
FIG. 9 is a view showing opening and closing sequences of switches in the circuit diagram of FIG. 6.

FIG. 9 is a view showing opening and closing sequences of the respective switches in the circuit diagram of FIG. 6. On/off operation sequences of all the switches are shown in FIG. 9.

Hereinafter, a concrete design example of the circuit of FIG. 6 and conditions to be considered in this case will be described.

Figure 10:
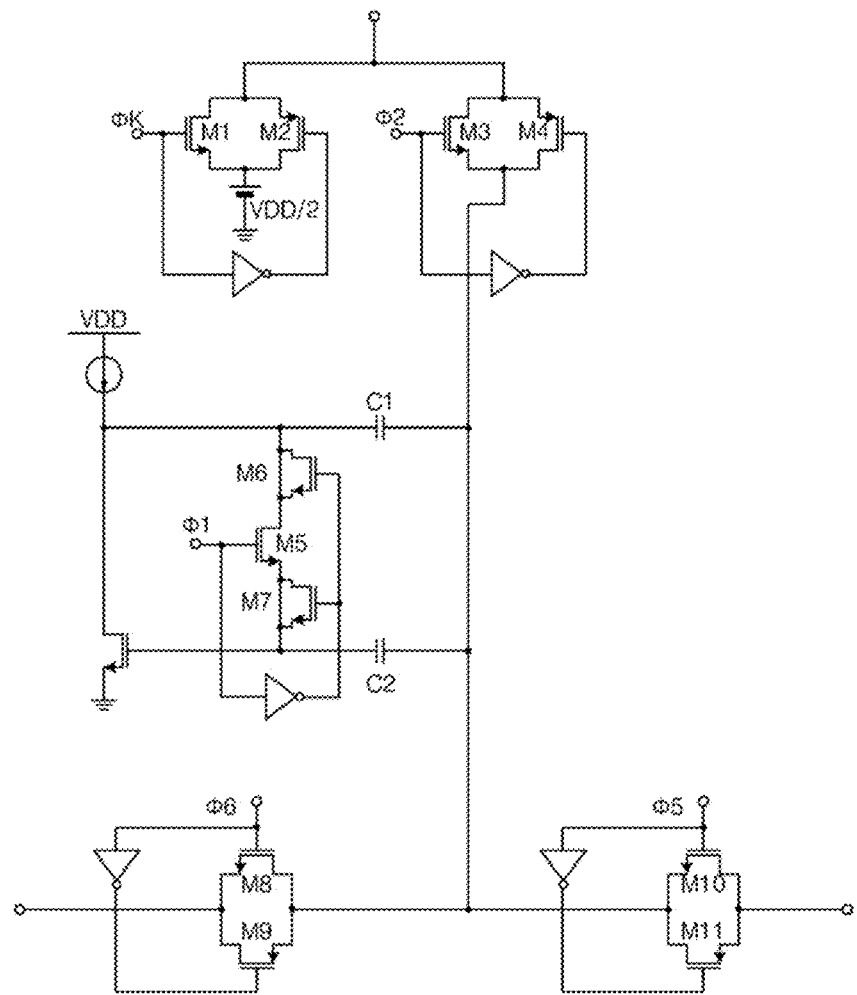
FIG. 10 is a circuit diagram showing a Miller capacitor structure of a first block of FIG. 6.

FIG. 10 is a circuit diagram showing the Miller capacitor structure of the first block of FIG. 6.

The Φ2, Φ5, Φ6, and Φk switches are designed to have complementary structures. The reason that switches having complementary structures are used is as follows.

When noise is generated in voltage introduced into the receiving unit from the touch pattern unit, the voltage is fluctuated upward and downward on the basis of reset voltage generated by the Φk switch (reset unit). At this time, when the reset voltage is connected to the ground GND, voltage introduced into the receiving unit 30 may fall to 0 or less. When the voltage falls to 0 or less, charge leakage may occur due to a reverse body diode of the MOSFET. If gate voltage of the switch is switched from 0 to VDD, and voltage introduced into the receiving unit (30) falls to 0 or less, it may not be possible to turn the switches completely off.

In order to prevent the occurrence of this phenomenon, the reset voltage generated by the Φk switch is set to VDD/2, and voltage introduced into the receiving unit is fluctuated upward and downward on the basis of VDD/2. Also, the complementary structures are adopted such that the switches are fully turned on during such an operation.

The switches having the above structures have advantages in that the switches are fully turned on irrespective of a voltage level, and charge injection is reduced when the switches are turned off.

In the Φ1 switch, the N-MOSFET and a dummy MOSFET having a size half that of the N-MOSFET are provided to reduce an effect of charge injection.

The bandwidth BW of the Miller capacitor structure is set to about 25 MHz such that the bandwidth is sufficiently large through adjustment of the amplitude of current of the current source and the size of the N-MOSFET to achieve rapid recovery with respect to noise change.

It is necessary for the ΦOk switch to rapidly reset the receiving side electrodes of the touch pattern unit. To this end, the size of the Φk switch is designed to be 10 times greater than each of the other switches.

Figure 11:
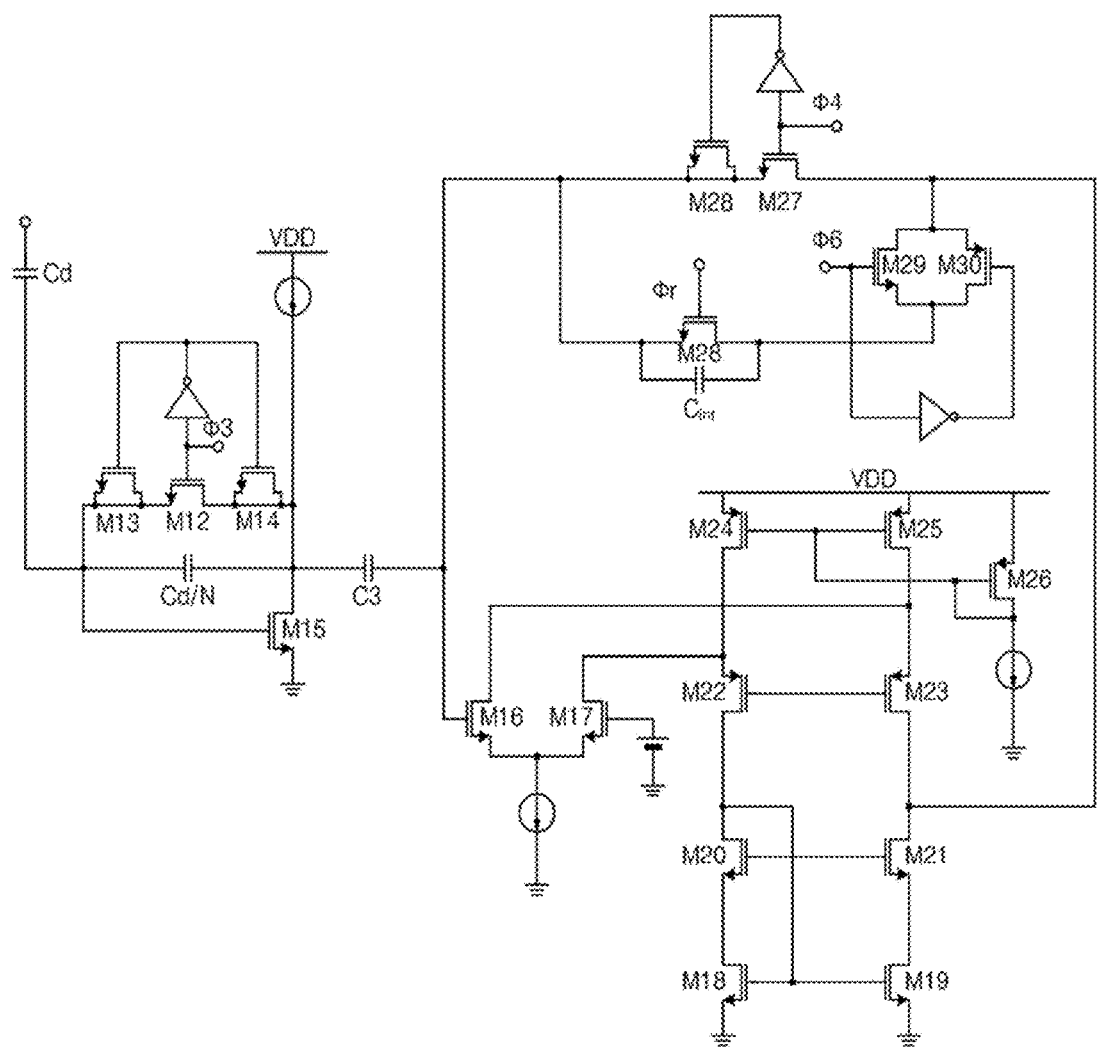
FIG. 11 is a circuit diagram showing structures of a second block and a third block of FIG. 6.

FIG. 11 is a circuit diagram showing the structures of the second block and the third block of FIG. 6.

The Φ3 switch is designed to have the N-MOSFET and a dummy MOSFET having a size half that of the N-MOSFET, thereby reducing an effect of charge injection. Also, a structure providing an effect of capacitive division is adopted to amplify voltage difference, which is simply realized by the N-MOSFET and the current source. In order to amplify voltage n times, the size of the capacitor of the second block is set to Cd/N. Also, in order to adjust an amplification rate, capacitors Cd having various sizes are provided such that one of the capacitors is selected. In the third block to accumulate an amplified difference value of voltage, a folded cascode amplifier is designed. A start value of voltage accumulated in the integration capacitor is set to VDD/2 by using the folded cascode amplifier instead of a simple single transistor amplifier When two neighboring receiving side electrodes are compared to extract a difference value, a charge flow direction is changed depending upon whether a higher voltage value is located at the right side or the left side with the result that voltage is also accumulated in the integration capacitor in opposite directions. For this reason, a start voltage is set to a voltage at the middle between destinations 0 and VDD in opposite directions, i.e. middle voltage VDD/2. The Φ4 switch is configured to have a dummy switch structure to reduce an effect of charge injection.

Finally, the Φ6 switch is configured to have a complementary structure such that a finally accumulated value of the integration capacitor passes irrespective of a voltage level of the finally accumulated value of the integration capacitor. This structure also serves to reduce an effect of charge injection.

Figure 12:
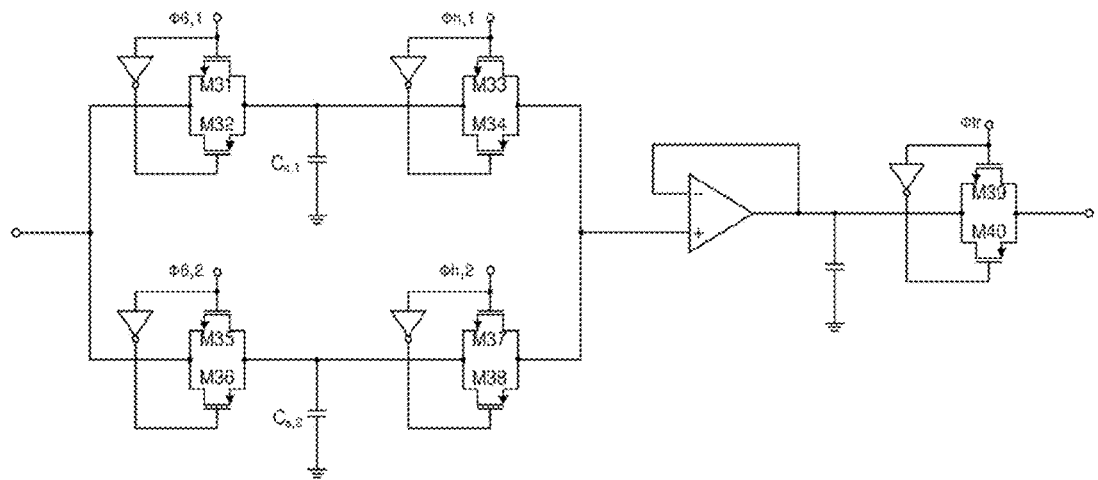
FIG. 12 is a circuit diagram showing the construction of S/H.

FIG. 12 is a circuit diagram showing the construction of S/H.

It is necessary for the switches of S/H to pass all voltage levels from 0 to VDD. To this end, the switches are designed to have complementary structures, by which an effect of charge injection is reduced. It is necessary for a buffer to be configured to have a rail to rail input output structure. Also, it is necessary for the buffer to have a sufficiently large gain such that the offset is not excessively generated. In addition, it is necessary for the buffer to transmit all values corresponding to one driving side electrode to the ADC within a short time. For this reason, it is determined that a bandwidth of 10 MHz or more and a sufficient slew rate are necessary when a large area is targeted. In order to form a buffer having such a structure, an amplifier as shown in FIG. 13 is designed.

Figure 13:
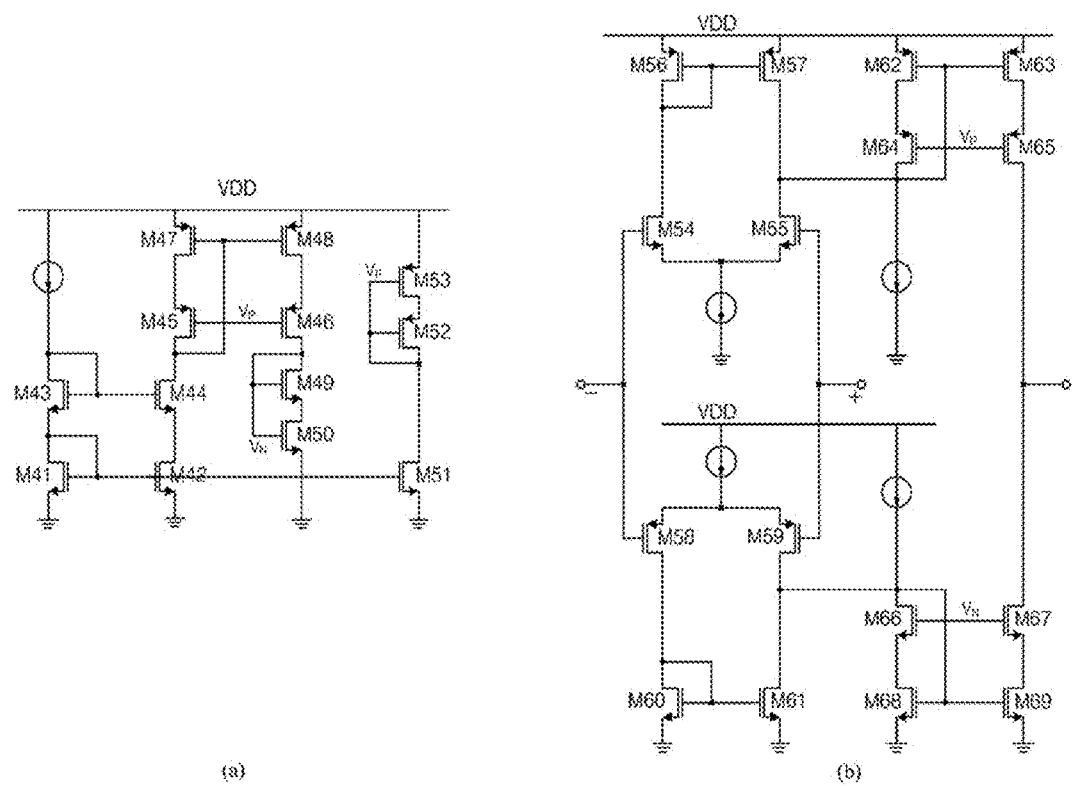
FIG. 13 is a circuit diagram showing the structure of an operation amplifier of S/H.

FIG. 13 is a circuit diagram showing the structure of an operation amplifier of S/H. An input stage of the operation amplifier is configured to have a complementary structure for rail to rail level input. Only a node of an output stage of the operation amplifier is designed as a current mirror type amplifier, which is a kind of high impedance node, since the output stage of the operation amplifier has a rail-to-rail level, and it is necessary to greatly increase the bandwidth BW in a state in which stability is secured.

Also, the output stage of the operation amplifier is designed in a cascode form to obtain a relatively high voltage gain. Biasing voltages VN and VP necessary in the cascode form are formed based on current and diodes M49, M50, M52, and M53 as shown in the FIG. 13(a).

Figure 14:
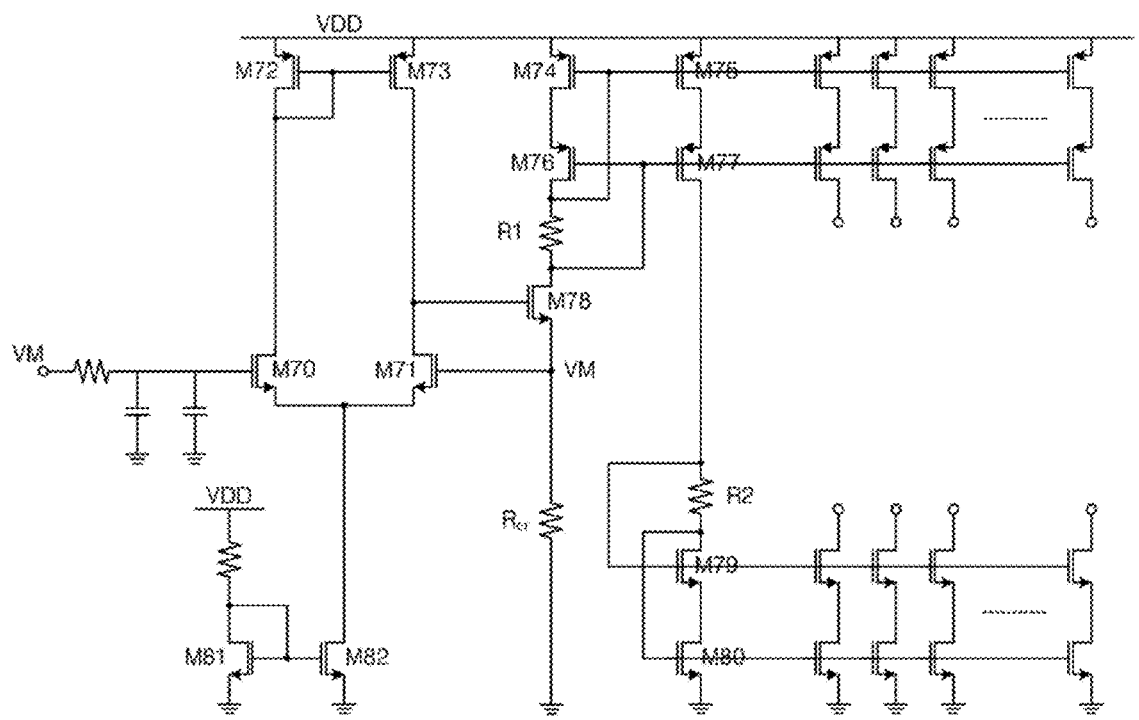
FIG. 14 is a circuit diagram showing a current supply structure necessary for each block of FIG. 6.

FIG. 14 is a circuit diagram showing a current supply structure necessary for each block of FIG. 6.

The current supply structure is designed such that desired current is formed based on constant external voltage VM and resistance Rcr, and the formed current is copied through a cascode current mirror to relatively accurately form a plurality of current sources. To this end, an amplifier is designed such that an output terminal of the amplifier is connected to a negative input terminal via a source follower M78. Also, bias voltage of a cascode current mirror is formed based on current flowing in the cascode current mirror and amplitude of resistances R1 and R2. Finally, accuracy in bias current of the amplifier is not considered, and therefore, the bias current of the amplifier is formed based on VDD, resistance, and a one-stage MOSFET mirror.

Hereinafter, the result of simulation in operation of the receiving unit of the present invention through a cadence tool will be described. For simulation, a touch pattern is configured in a circuit form through RC modeling, and voltage is applied to the model to observe a signal corresponding thereto. In this way, the operation of the receiving unit is confirmed. The touch pattern is modeled while including parasitic resistance, coupling capacitance, and vertical capacitance.

Figure 15:
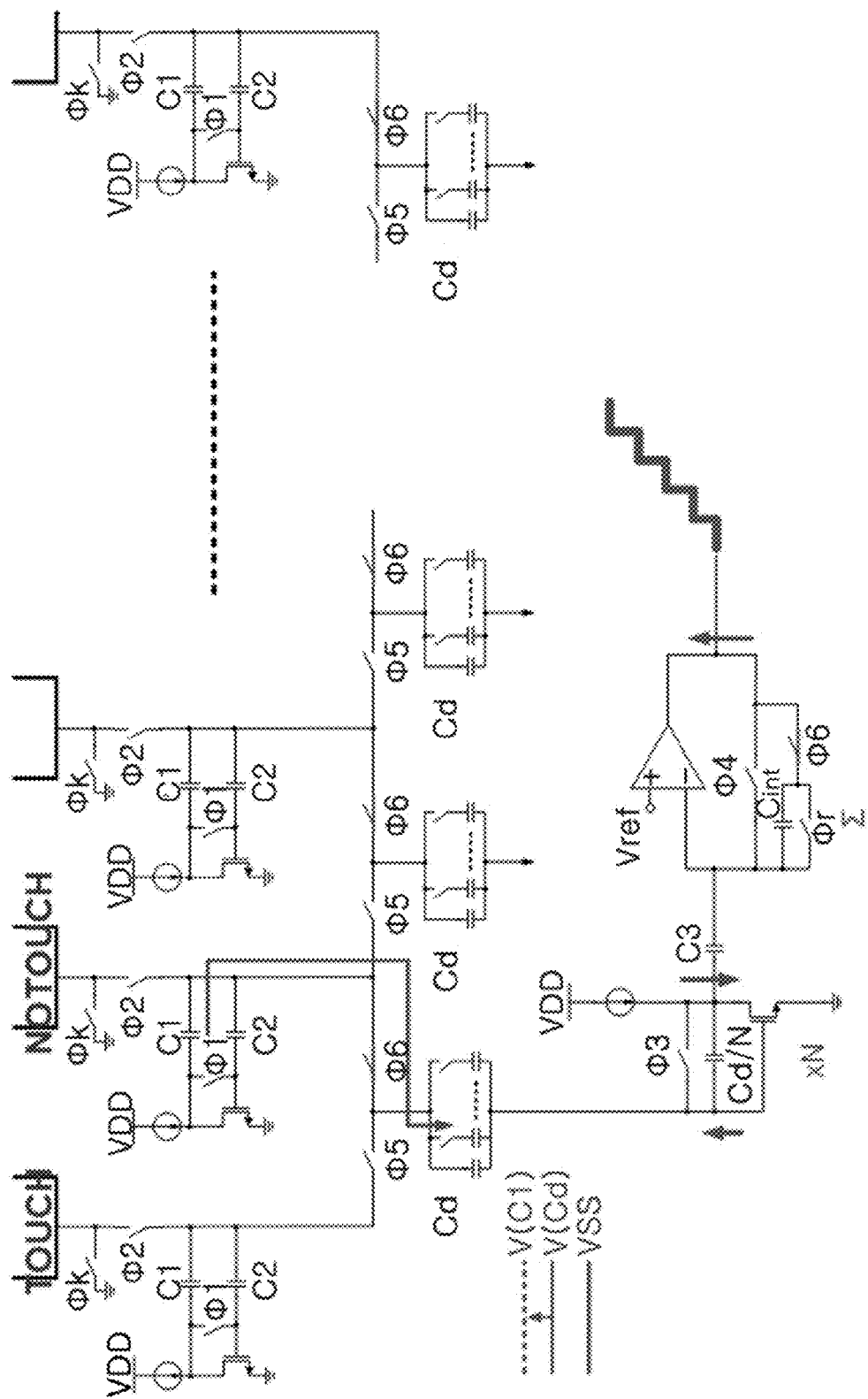
FIG. 15 is a first reference view showing a voltage waveform generated according to whether a touch has occurred.
Figure 16:
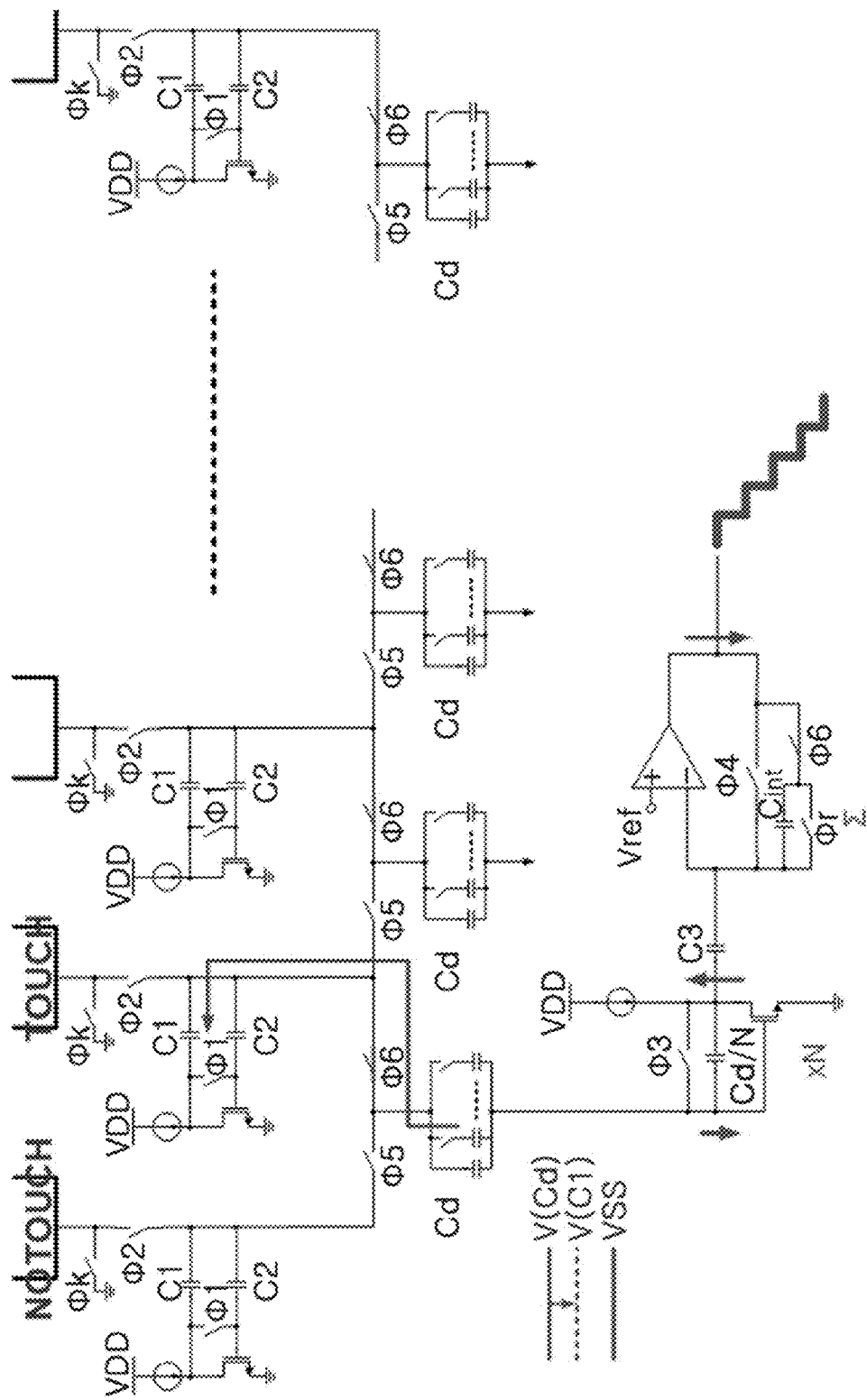
FIG. 16 is a second reference view showing a voltage waveform generated according to whether a touch has occurred.
Figure 17:
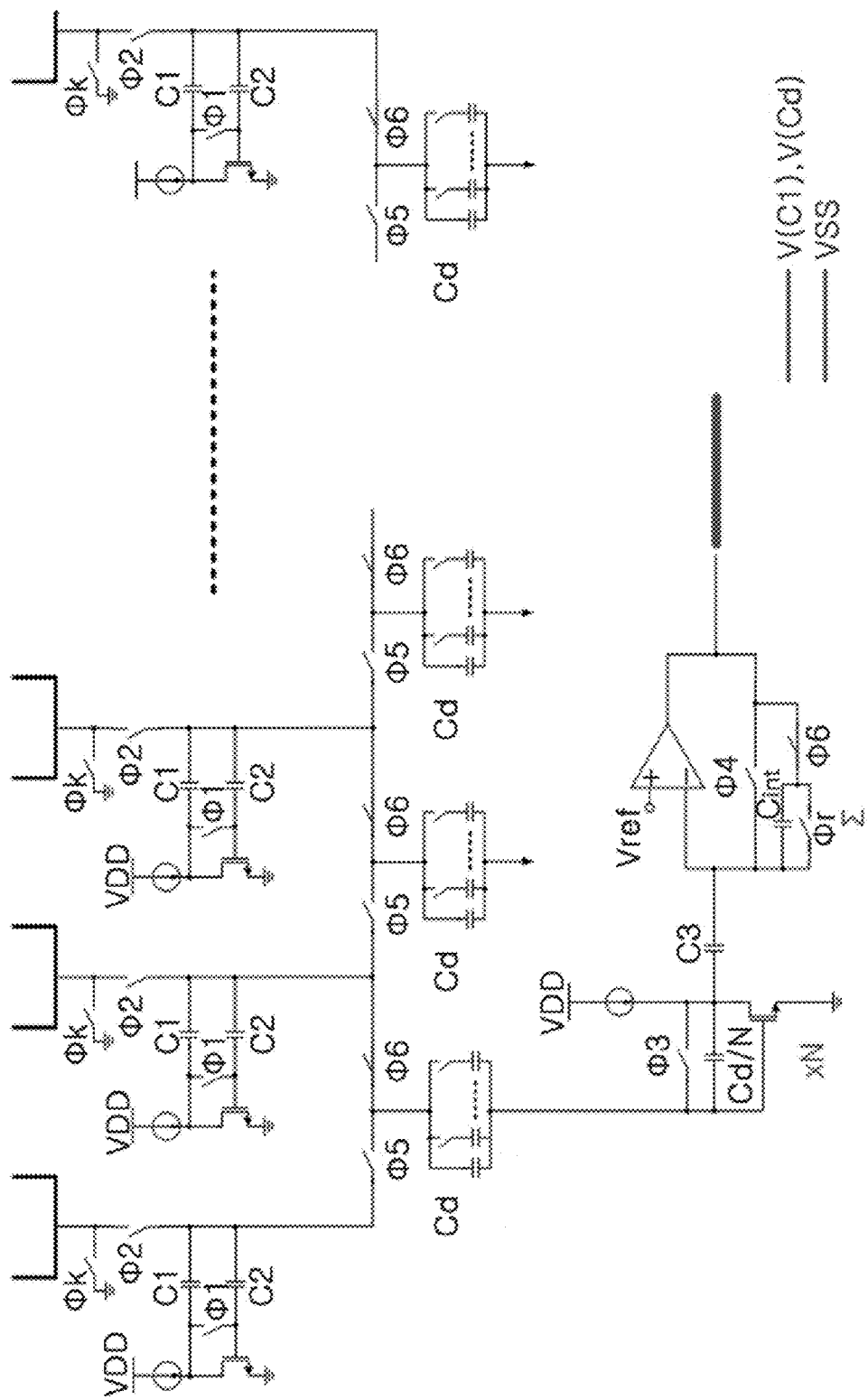
FIG. 17 is a third reference view showing a voltage waveform generated according to whether a touch has occurred.

FIG. 15 is a first reference view showing a voltage waveform generated according to whether a touch has occurred, FIG. 16 is a second reference view showing a voltage waveform generated according to whether a touch has occurred, and FIG. 17 is a third reference view showing a voltage waveform generated according to whether a touch has occurred.

A capacitor voltage of S/H is observed to verify the receiving unit of the present invention. Theoretical forms of a simulation waveform based on the structure of the receiving unit are shown in FIGS. 15 to 19.

When a voltage value of the capacitor Cd storing a voltage value of one receiving side electrode which has been touched is compared with voltage values of the capacitors C1 and C2 storing voltage values of the other receiving side electrodes which have not been touched, the voltage of the capacitor Cd is changed into that of the capacitor C1 due to a Miller effect of the capacitor C1.

When a touch occurs at this time, lower voltage is generated, and therefore, the voltage of the capacitor Cd is increased at the time of voltage comparison. Consequently, the output of the voltage amplification structure is lowered.

As a result, the voltage of the S/H capacitor is increased in a stepwise form during charge accumulation. In the opposite case, the voltage of the S/H capacitor is decreased in a stepwise form. If touch states of the two compared receiving side electrodes are the same (both the receiving side electrodes have been touched or have not been touched), there is no voltage change based on voltage comparison, and therefore, the voltage of the S/H capacitor is also held.

Figure 19:
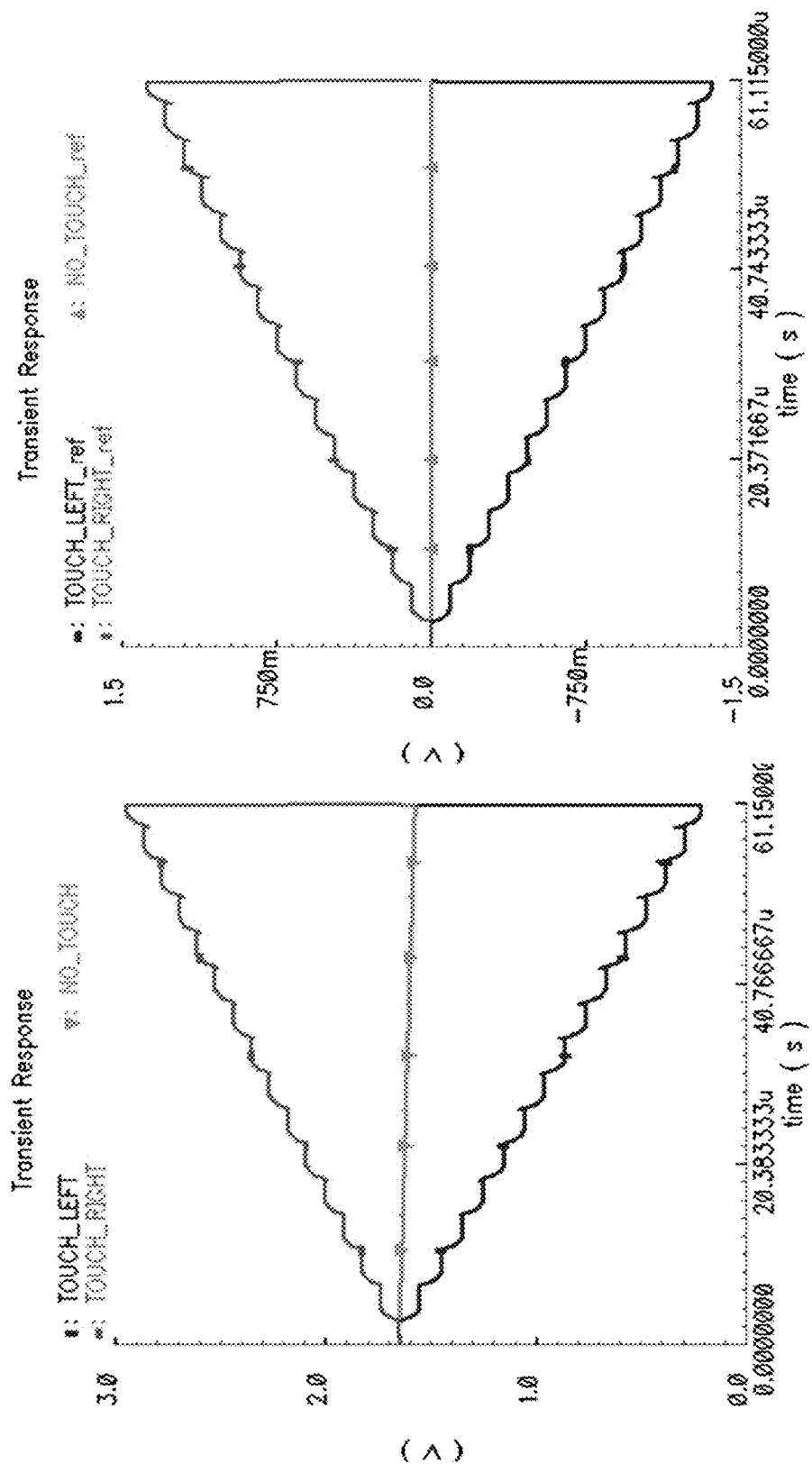
FIG. 19 is a first graph showing a voltage waveform according to simulation of the present invention.

FIG. 19 is a first graph showing a voltage waveform according to simulation of the present invention. A real simulation waveform is the same as shown in FIG. 19.

This is a simulation waveform without noise. For modeling of a touch, coupling capacitance of a point which is touched is set to be less than other coupling capacitances.

At this time, it can be seen that the waveform is similar to the theoretical form as described above. Consequently, this may mean verification of normal operation of a circuit. The FIG. 19(a) shows the original form of voltage. It can be seen that voltage, which should be uniform, has a slightly downward slope. Such a tilting phenomenon may be caused by a subordinate effect, such as charge injection, of the switches during a repetitive integration process. At this time, in a case in which a value having a downward slope by such an effect is set to a basic value, and the other values are set to relative values of the basic value, it may be possible to easily recognize a touch point through subsequent digital processing in consideration of the fact that a voltage waveform at the left side of the touch panel is opposite to that at the right side of the touch panel on the basis of the touch point.

A waveform based on the basic value is the same as the FIG. 19(b). At this time, two waveform components directed upward and downward are almost symmetric with respect to a straight middle line indicating the basic value.

Figure 18:
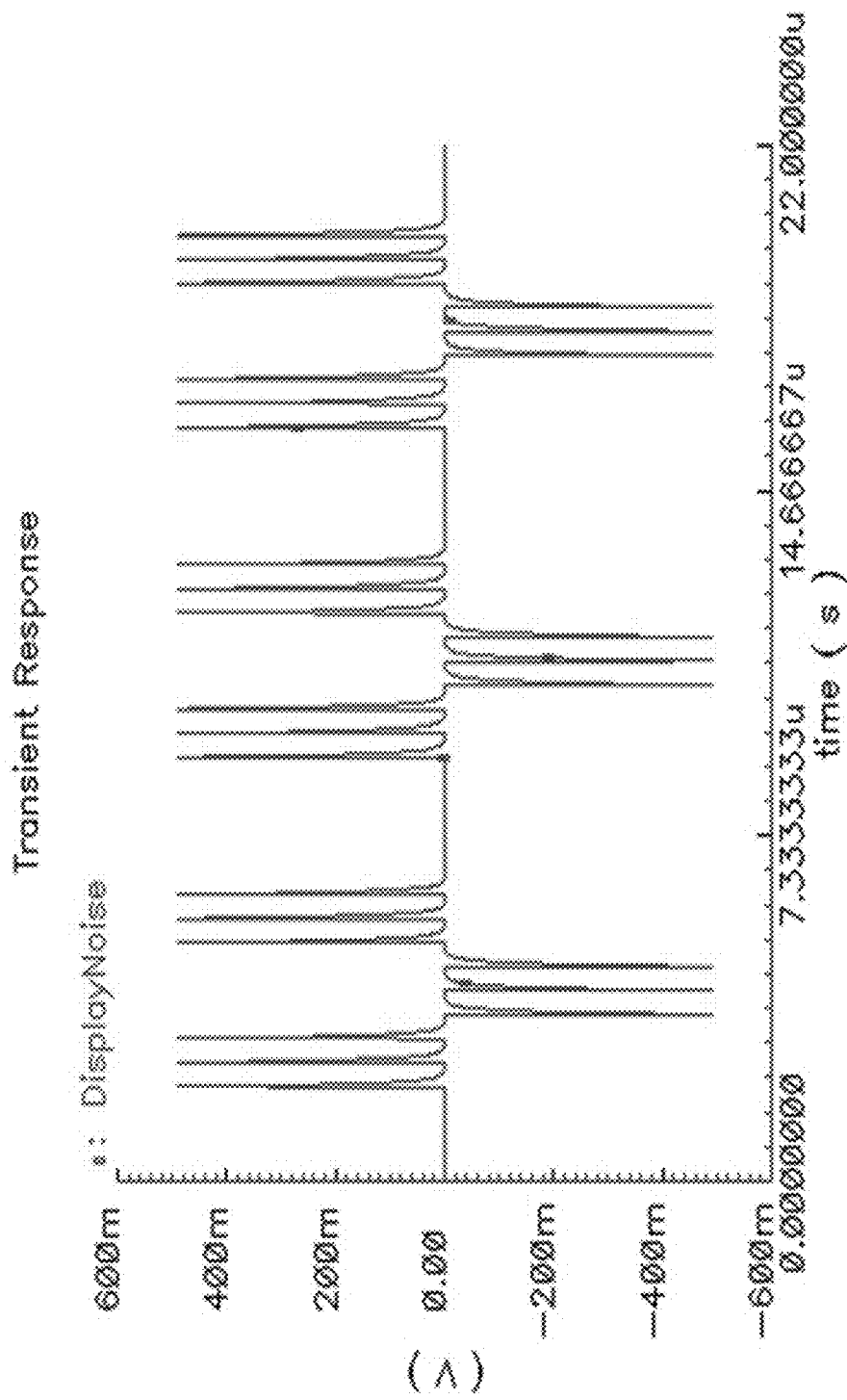
FIG. 18 is a graph showing a noise waveform generated by a noise generator.
Figure 20:
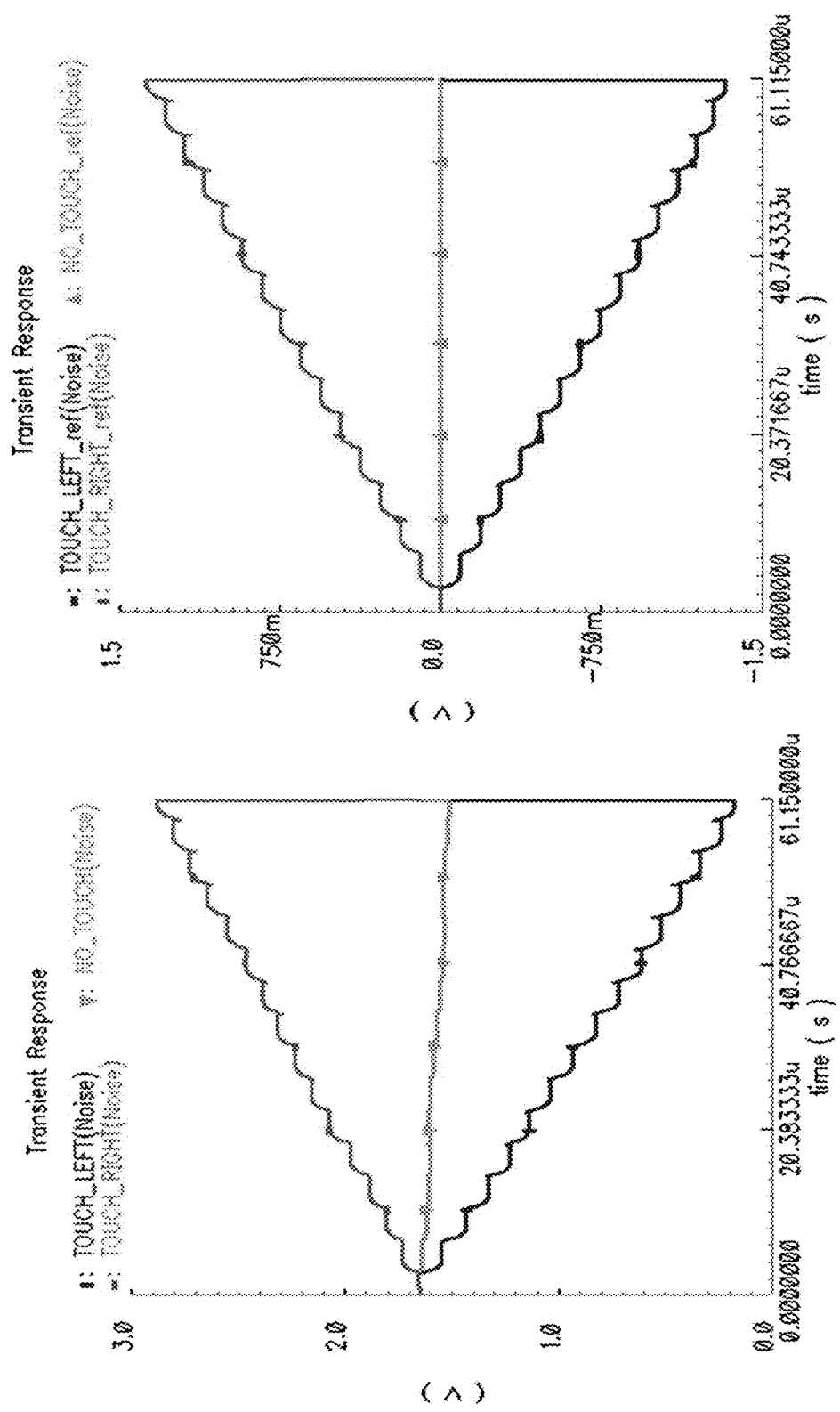
FIG. 20 is a second graph showing a voltage waveform according to simulation of the present invention.

FIG. 18 is a graph showing a noise waveform generated by a noise generator, and FIG. 20 is a second graph showing a voltage waveform according to simulation of the present invention. Specifically, FIG. 20 shows a waveform when display noise as shown in FIG. 18 is modeled and the modeled display noise is applied to a touch pattern RC model. The display noise is modeled such that the display noise is introduced through a vertical capacitance of the touch pattern.

This waveform also proves normal operation of the circuit, based on which it can be analogized that it is possible to recognize a touch without difficulty. The FIG. 20(b) also shows a waveform based on a basic value.

Figure 21:
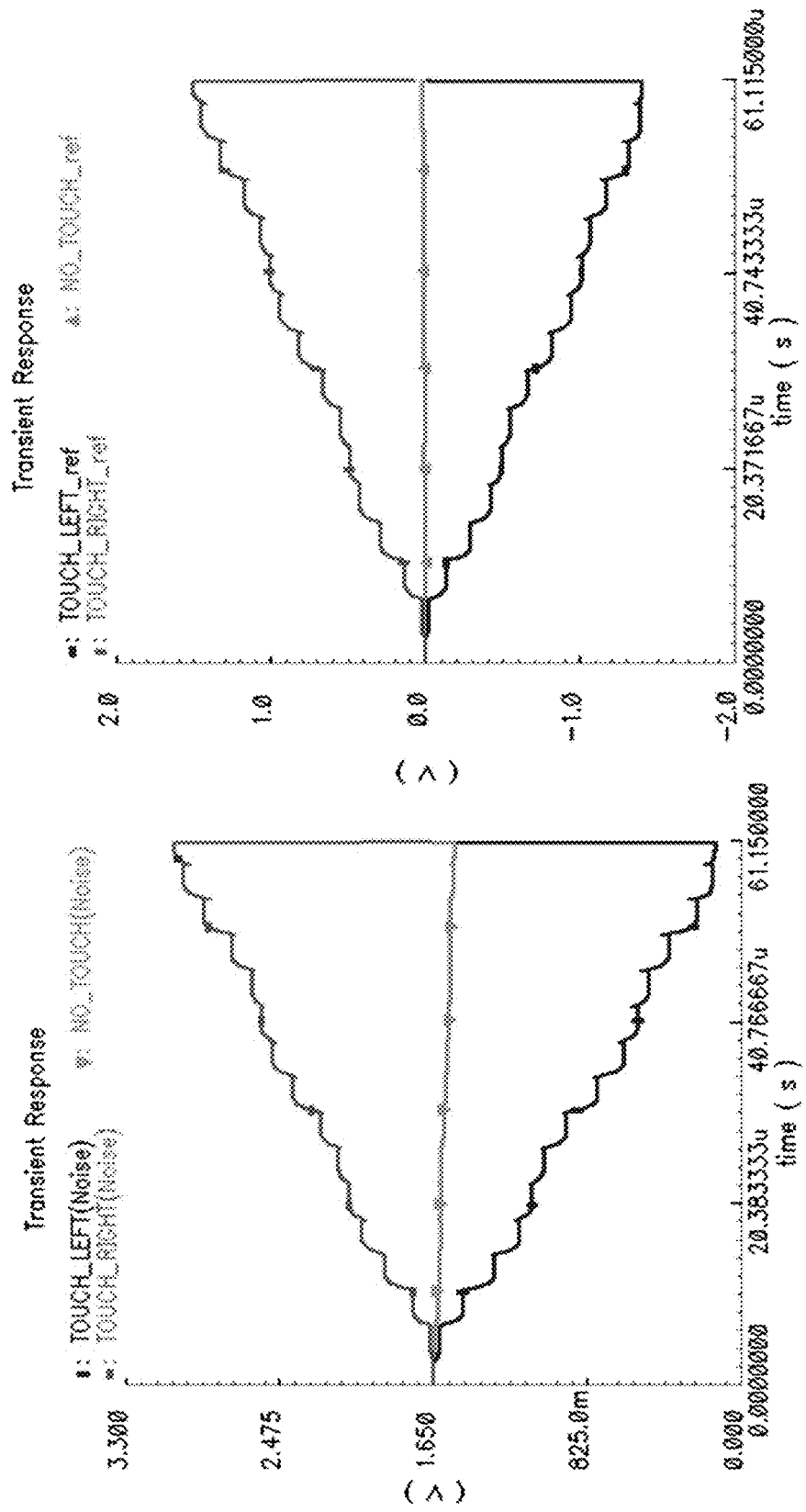
FIG. 21 is a third graph showing a voltage waveform according to simulation of the present invention.

FIG. 21 is a third graph showing a voltage waveform according to simulation of the present invention. This is a waveform generated when both display noise and touch noise (60 Hz noise and 50 kHz noise) are applied. In order to model the introduction of noise, capacitance is located between a noise source and a touch pattern, which is touched.

This waveform is distorted as compared with the above waveforms. However, this waveform roughly coincides with the above waveforms. This waveform improves normal operation of the circuit, based on which it can be analogized that it is possible to recognize a touch. The FIG. 21(b) also shows a waveform based on a basic value.

The above simulation waveforms prove normal operation of the receiving unit of the present invention. Final values of the waveforms obtained as described above are digitally converted by the A/D conversion unit and then digitally processed with the result that it is possible to recognize a touch.

Figure 22:
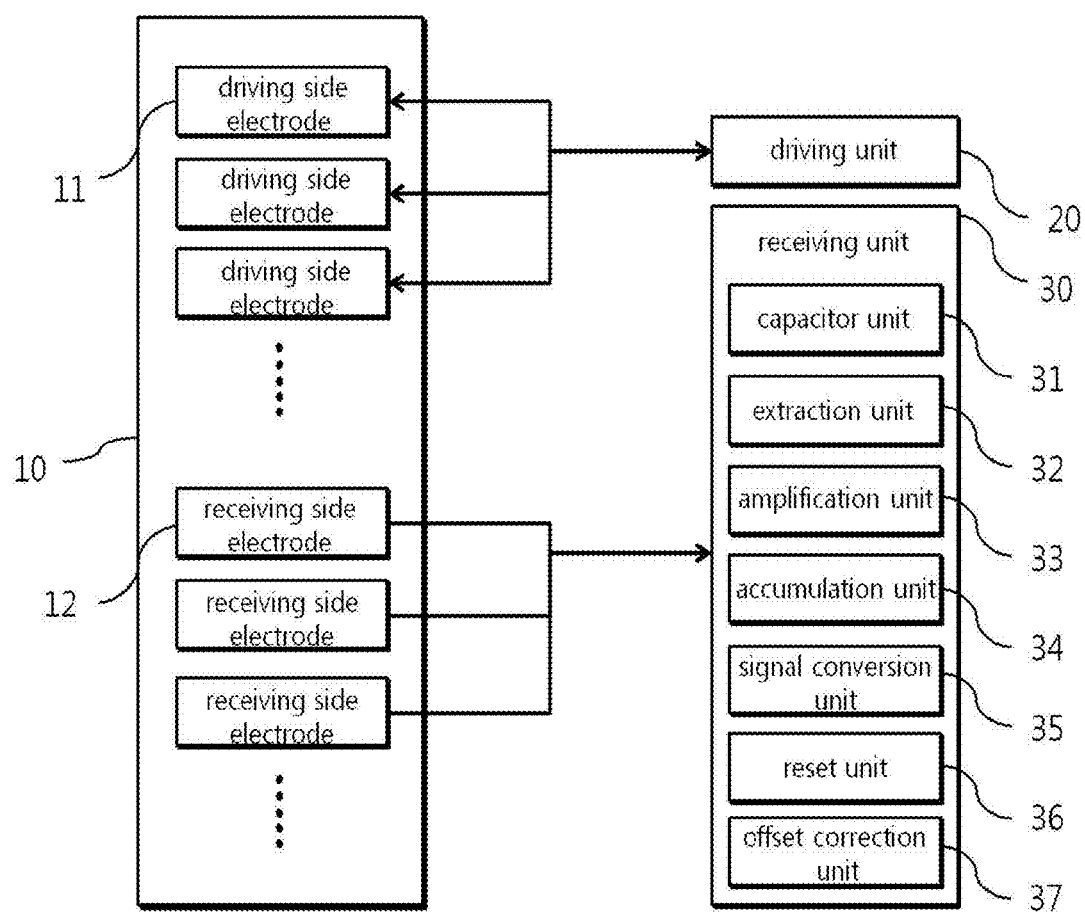
FIG. 22 is a block diagram showing the construction of a signal detection system of a large-sized capacitive multi touch screen according to a second embodiment of the present invention.
Figure 23:
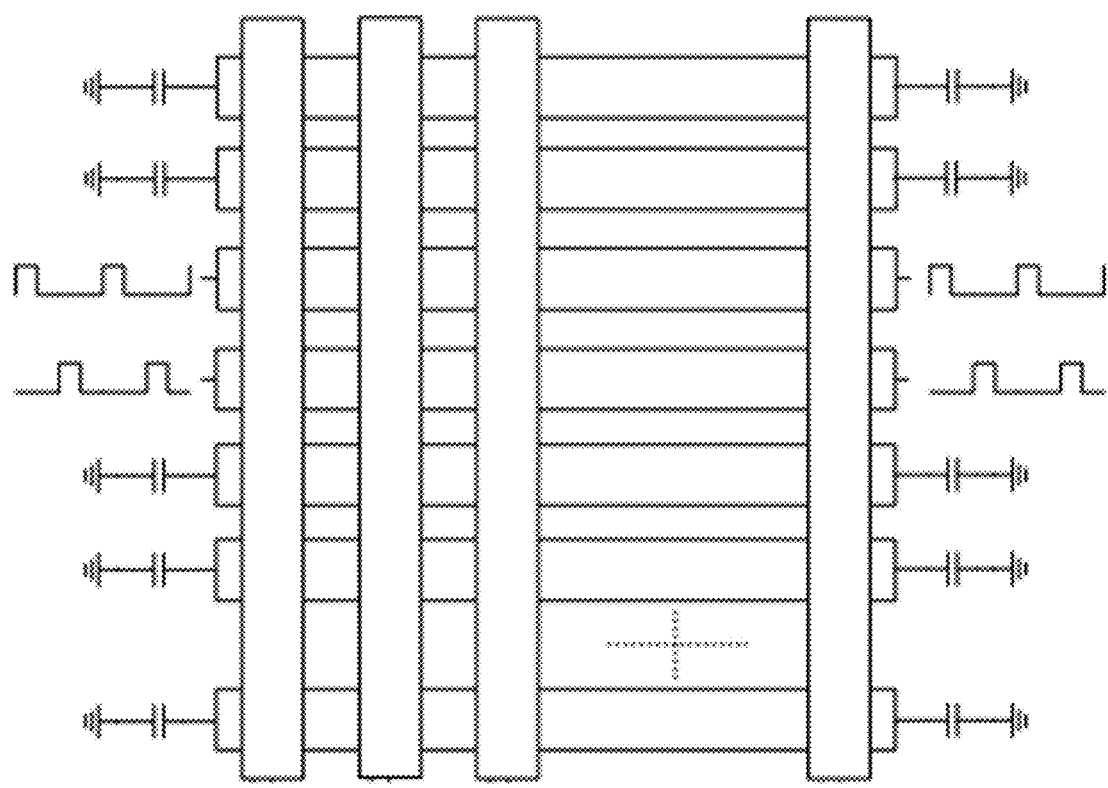
FIG. 23 is a conceptual view showing a drive signal applied in the second embodiment of the present invention.

FIG. 22 is a block diagram showing the construction of a signal detection system of a large-sized capacitive multi touch screen according to a second embodiment of the present invention, and FIG. 23 is a conceptual view showing a drive signal applied in the second embodiment of the present invention. This embodiment is identical to the first embodiment of the present invention except that an offset correction unit to solve an offset generated in a circuit is further included.

The signal detection system according to the second embodiment of the present invention includes a touch pattern unit (10) including a plurality of driving side electrodes (11) and a plurality of receiving side electrodes (12), a driving unit (20), and a receiving unit (30). A basic concept of a signal detection system of a touch screen to recognize a touch using coupling capacitance generated between the driving side electrodes and the receiving side electrodes is identical to that of the signal detection system according to the first embodiment of the present invention. Therefore, a description of the construction of the signal detection system according to the second embodiment of the present invention identical to that of the signal detection system according to the first embodiment of the present invention will be omitted, and only the difference between the signal detection system according to the second embodiment of the present invention and the signal detection system according to the first embodiment of the present invention will hereinafter be described.

Specifically, the driving unit (20) simultaneously applies drive signals to two neighboring driving side electrodes. At this time, the drive signals are applied such that time difference is generated between pulses input to both the driving side electrodes, and an offset is corrected based on signal difference between the driving side electrodes, to which the drive signals are applied. Of course, the other driving side electrodes, to which no drive signals are applied, may be floated in the same manner as in the first embodiment. Also, a drive signal may be simultaneously applied to opposite ends of each driving side electrode in the same manner as in the first embodiment.

The drive signal applied to one of the driving side electrodes is a drive signal to store an offset, and the drive signal applied to the other driving side electrode is a drive signal to subtract the offset stored by the former driving side electrode and to transmit the subtracted offset as an output signal.

The receiving unit (30) is similar to that of the first embodiment in that the receiving unit (30) is connected to one end of each receiving side electrode to extract, amplify, and output a difference value between neighboring receiving side electrodes. In this embodiment, however, two difference values between the receiving side electrodes are successively generated due to the drive signals applied to the two receiving side electrodes, and therefore, the former difference value is subtracted from the latter difference value, and the subtracted difference value is output. Also, the receiving side electrodes that do not receive the drive signals from the driving side electrodes are floated in the same manner as in the first embodiment.

Specifically, the receiving unit (30) includes a capacitor unit (31) connected to one end of each receiving side electrode (12) to collect charges based on a drive signal, an extraction unit 32 to extract a signal difference value between a receiving side electrode and a neighboring receiving side electrode, an amplification unit (33) to amplify the difference value extracted by the extraction unit (32), an offset correction unit (37) to store the amplified difference value for a drive signal of one of the driving side electrodes and to subtract the stored difference value from the amplified difference value for a drive signal of another of the driving side electrodes, an accumulation unit (34) to accumulate, store, and output the value output from the offset correction unit (37), and a signal conversion unit (35) to convert the accumulation signal output from the accumulation unit (34) into a digital value and to output the digital value.

Figure 25:
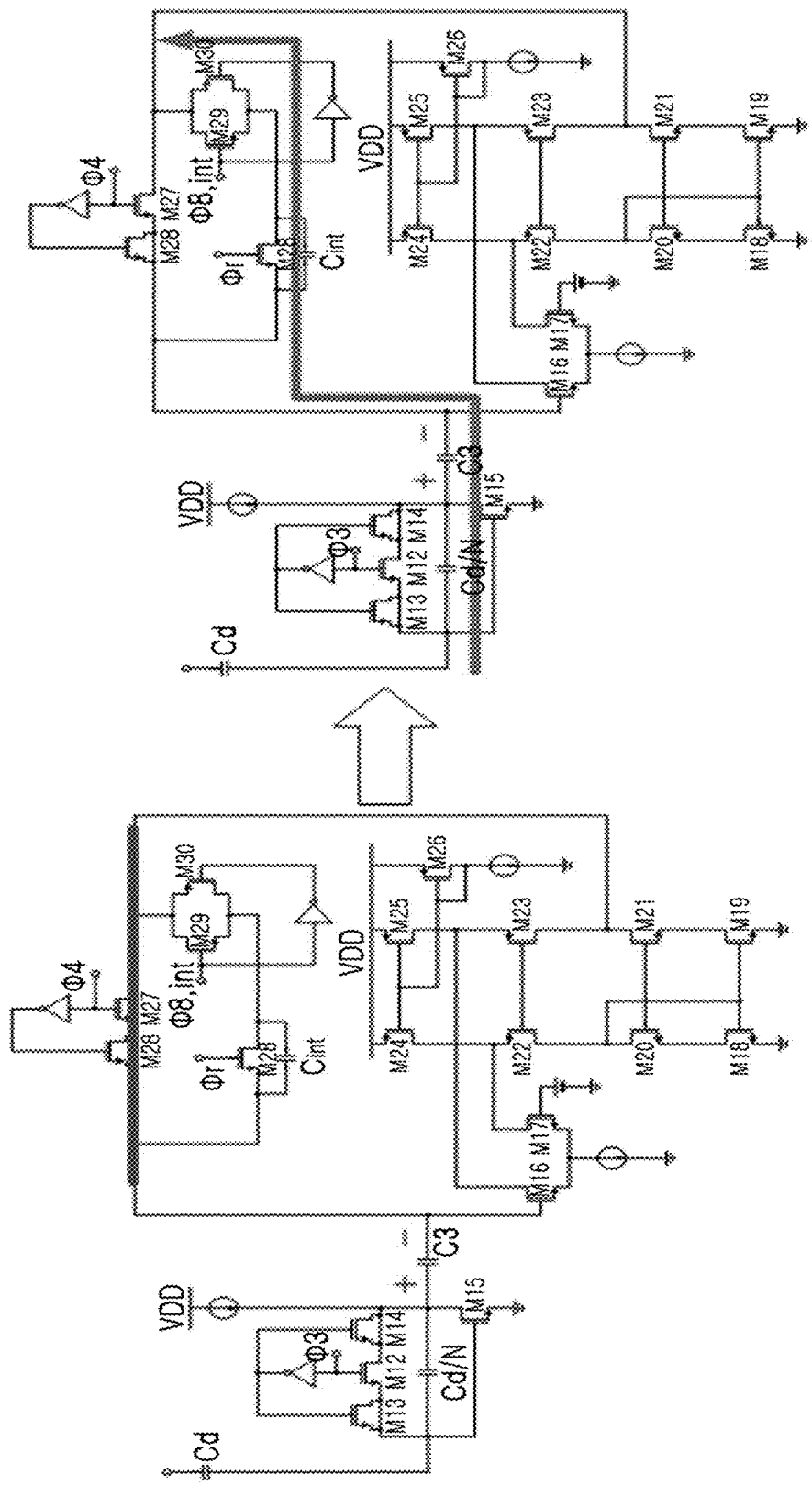
FIG. 25 is a circuit diagram showing an offset correction method.
Figure 26:
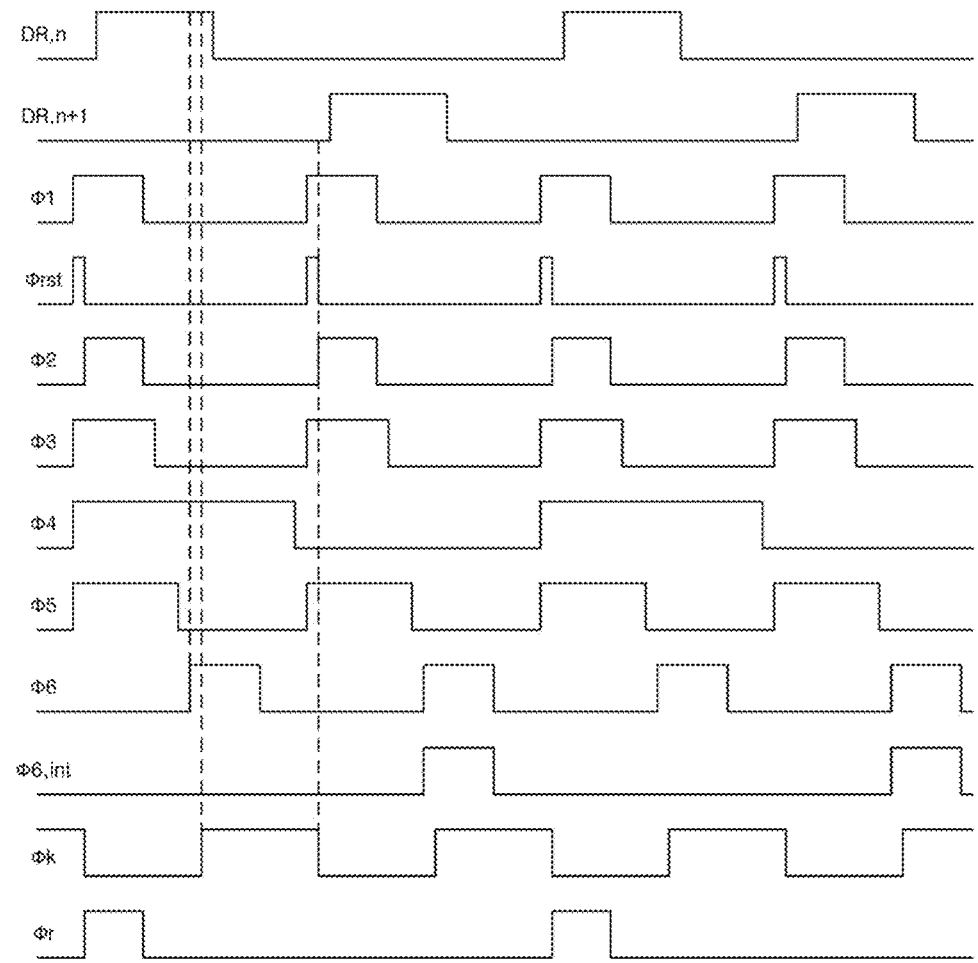
FIG. 26 is a view showing the opening and closing sequence of switches in the circuit diagram of FIG. 25.

Concrete operation of the receiving unit (30) will be described based on two methods. FIG. 25 is a circuit diagram showing an offset correction method, and FIG. 26 is a view showing the opening and closing sequence of switches in the circuit diagram of FIG. 25.

When a drive signal is applied to a first driving side electrode, a Φ4 switch is turned on, and an amplified difference value generated at that time is stored in a capacitor C3. After an offset value is stored in the capacitor C3, a Φ4 switch is turned off and is then kept off to maintain the value stored in the capacitor C3. Subsequently, a difference value of a signal generated when a drive signal is applied to the next driving side electrode is amplified, the offset value stored through the former driving side electrode is subtracted from the amplified value, and the subtracted value is accumulated in an integration capacitor Cint. These driving operations are alternately performed to continuously accumulate amplified difference values from which the offset is removed.

Figure 27:
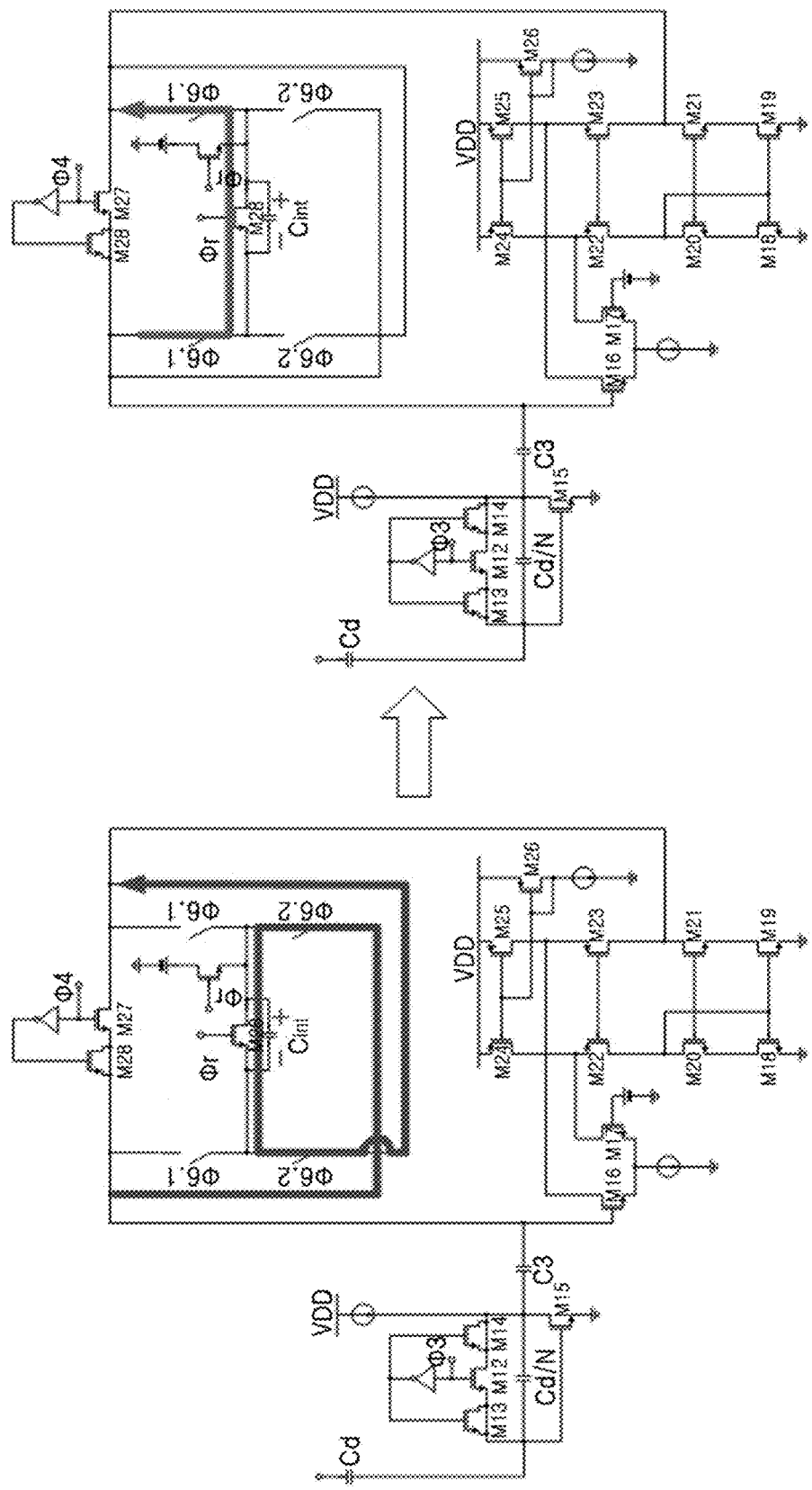
FIG. 27 is a circuit diagram showing another offset correction method.
Figure 28:
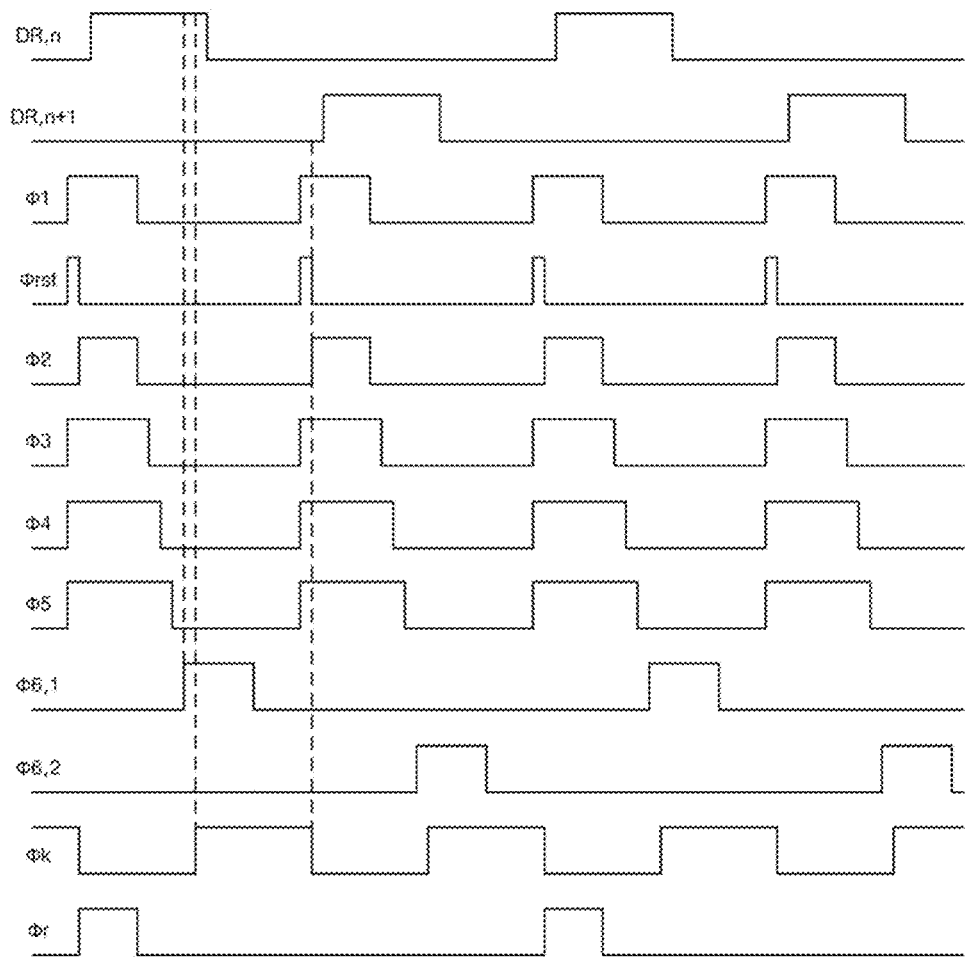
FIG. 28 is a view showing the opening and closing sequence of switches in the circuit diagram of FIG. 27.

FIG. 27 is a circuit diagram showing another offset correction method, and FIG. 28 is a view showing the opening and closing sequence of switches in the circuit diagram of FIG. 27. An offset is corrected using a method different from the method described above with reference to FIG. 25.

This method is identical to the former method in terms of the application of drive signals to the driving side electrode. However, this method is different from the former method in that an integration capacitor Cint stores an offset instead of a capacitor C3. As a result, the operation of the receiving unit (30) based on this method is different from that of the receiving unit (30) based on the former method. In this case, swapping occurs between a capacitor Cint connection route at a phase to store an offset according to a first drive signal and a capacitor Cint connection route at the next phase, thereby achieving offset correction. In the structure in which the offset is stored in the capacitor C3 as shown in FIG. 25, it is not possible to correct the offset when a uniform charge causing the offset is introduced into the capacitor Cint. In the structure shown in FIG. 27, on the other hand, it is possible to correct an offset generated in such a route.

Figure 29:
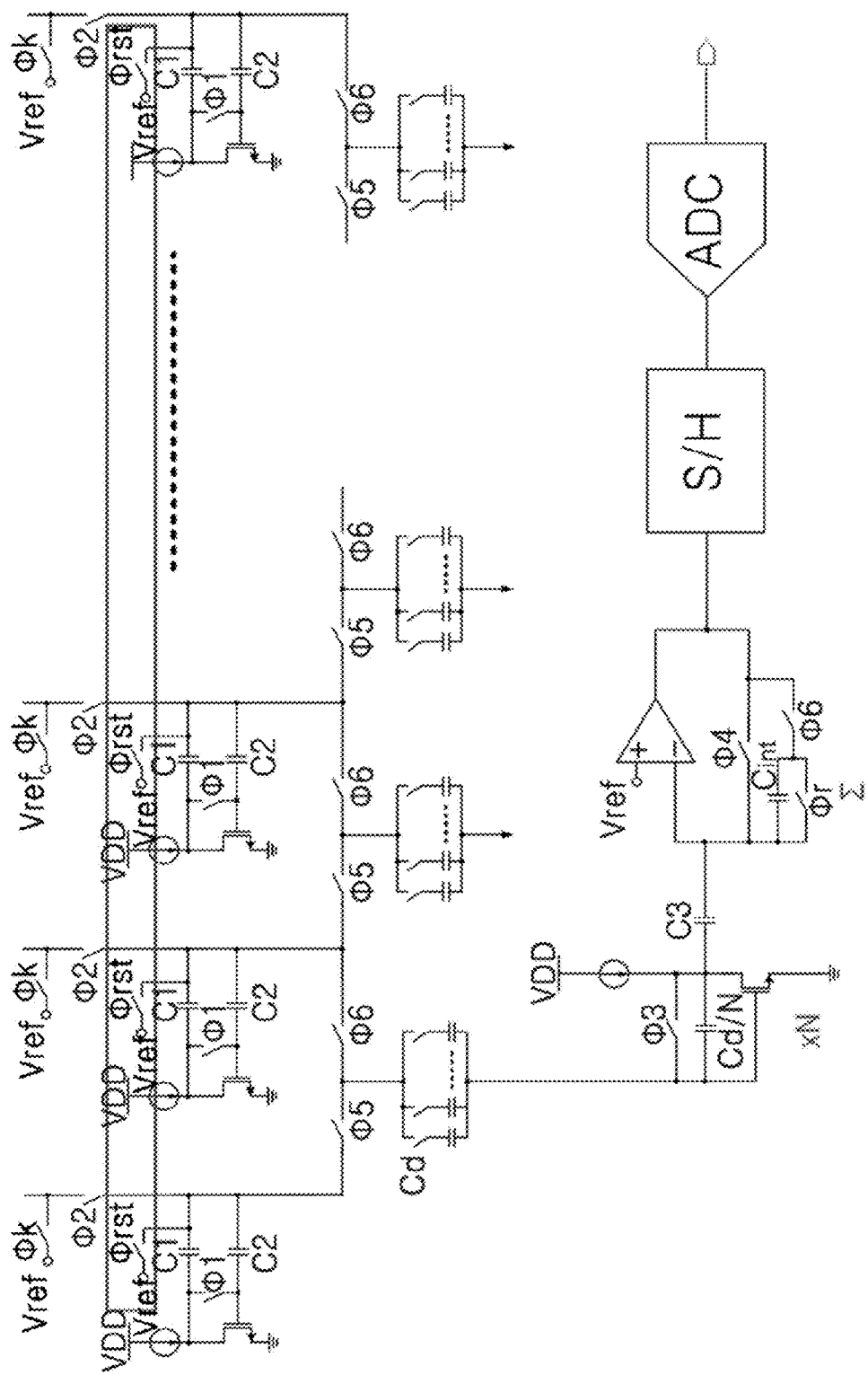
FIG. 29 is a view showing a circuit further including a switch to reset a Miller capacitor structure.

FIG. 29 is a view showing a circuit further including a switch to reset a Miller capacitor structure. In the switch sequences of FIGS. 26 and 28, the operation of a switch to reset the capacitors C1 and C2 (Miller capacitors), i.e. a Φrst switch, is also included. This is provided to further clarify an initial value of the capacitor.

Figure 24:
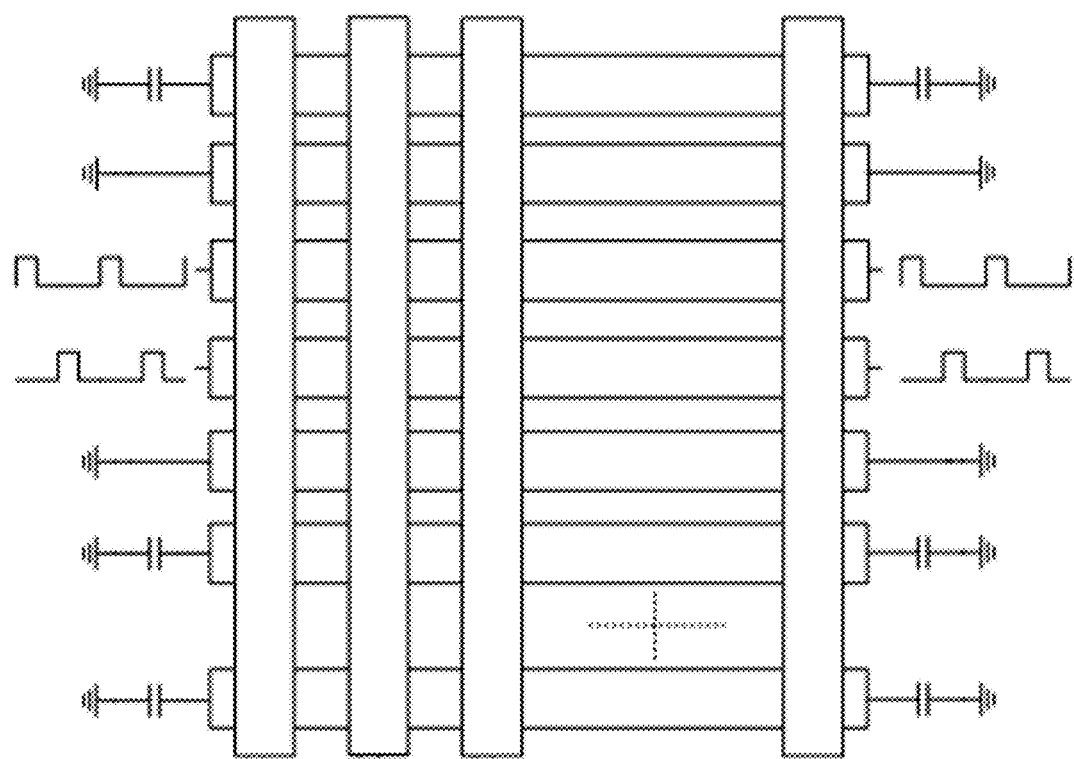
FIG. 24 is a conceptual view showing a state in which a driving side electrode adjacent to a driving side electrode to which the drive signal is applied in FIG. 22 is grounded.

FIG. 24 is a conceptual view showing a state in which a driving side electrode adjacent to the driving side electrode to which the drive signal is applied in FIG. 22 is grounded. The driving unit (20) grounds driving side electrodes adjacent to the driving side electrodes to which the drive signals are applied and floats the other driving side electrodes excluding the driving side electrodes to which the drive signals are applied or the grounded driving side electrodes.

In conventional methods, wires connected to the driving side electrodes are arranged in a dense state with the result that an undesired signal is generated from driving side electrodes to which a drive signal is not applied due to coupling capacitance between the wires.

Although such a signal has little effect, an incorrect value may be output to the receiving unit due to the signal. In order to prevent the occurrence of such a phenomenon, therefore, the other driving side electrodes excluding a driving side electrode to which a drive signal is applied are not floated but two driving side electrodes most adjacent to the driving side electrode to which the drive signal is applied are grounded. In this case, a shield effect is obtained, and a coupling signal transmitted to the other driving side electrodes is reduced.

When describing based on the previously described structure, a plurality of wires extends as shown in FIG. 2. At this time, coupling capacitance is inevitably present between the wires in a region at which the wires are close to each other (clustered). An undesired signal is coupled due to such coupling capacitance, the coupled signal is applied to the other driving side electrodes which are floated, and the applied signal is undesirably output. In order to solve such a problem, therefore, two driving side electrodes most adjacent to a driving side electrode to which a drive signal is applied are grounded. In this case, a slight sacrifice is incurred in terms of RC delay (because the purpose of floating is to reduce RC delay) but such sacrifice may be insignificant for a large-sized touch screen.

As is apparent from the above description, a signal detection system of a large-sized capacitive multi touch screen has effects in that it is possible to effectively solve an effect of noise and a signal distortion phenomenon, which are serious problems caused when the size of a convention capacitive touch screen is increased, and to exhibit high accuracy and excellent characteristics while reducing parasitic resistance and parasitic capacitance, which are increased as the size of the screen is increased.

Consequently, it is possible to provide an improved service for efficient task processing through popularization of a capacitive touch screen having higher characteristics than a conventional infrared or camera type touch screen in a market for a large-sized multi touch screen, the demand of which is increased in educational and industrial fields.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A signal detection system of a large-sized capacitive multi-touch screen to recognize a touch using coupling capacitance, the signal detection system comprising:
   a touch pattern unit comprising:
   a plurality of receiving side electrodes arranged side by side, the plurality of driving side electrodes being arranged in a predetermined relationship to the receiving side electrodes;
   a driving unit connected to said plurality of driving side electrodes and sequentially applying a drive signal to each of the driving side electrodes from one side of the driving side electrodes to the other side of the driving side electrodes, wherein the driving unit leaves other driving side electrodes to which the drive signal is not applied in a floating state; and
   a capacitor unit collecting electric charge based on the drive signal, the capacitor unit including a plurality of capacitor-switch circuits, each capacitor-switch circuit corresponding to a different one of the receiving side electrodes, said each capacitor-switch circuit including:
   a first switch having a first terminal connected to an end of the corresponding one of the receiving side electrodes,
   a first capacitor having a first terminal connected to a second terminal of the first switch,
   a second capacitor having a first terminal connected to the second terminal of the first switch,
   a second switch having a first terminal connected to a second terminal of the first capacitor and a second terminal connected to a second terminal of the second capacitor,
   a third switch having a first terminal connected to the second terminal of the first switch,
   a third capacitor having a first terminal connected to a second terminal of the third switch,
   a fourth switch having a first terminal connected to the second terminal of the third switch and a second terminal connected to a second terminal of a first switch of a neighboring one of the receiving side electrodes,
   an extraction unit connected to a second terminal of the third capacitor and extracting a signal difference value between one of the receiving side electrodes to which the drive signal is applied and a neighboring one of the receiving side electrodes to which the drive signal is not applied,
   an amplification unit connected to an output of the extraction unit and amplifying the extracted signal difference value,
   an accumulation unit connected to an output of the amplification unit, accumulating and storing the amplified signal difference value, and outputting an accumulated signal, and
   a signal conversion unit connected to an output of the accumulation unit and converting the accumulated signal into a digital value.

2. The signal detection system according to claim 1, wherein the driving unit simultaneously applies the drive signal to opposite ends of a corresponding one of the driving side electrodes.

3. The signal detection system according to claim 1, wherein neighboring ones of the receiving side electrodes are combined into a group such that the receiving side electrodes are arranged in groups.

4. The signal detection system according to claim 1, wherein the capacitor unit and the extraction unit have a Miller capacitor structure.

5. The signal detection system according to claim 1, wherein the receiving unit further comprises a reset unit to reset each of the receiving side electrodes, the reset unit having a first terminal connected to the first terminal of the first switch and a second terminal connected to a ground.

6. A signal detection system of a large-sized capacitive multi-touch screen to recognize a touch using coupling capacitance, the signal detection system comprising:
   a touch pattern unit comprising:
   a plurality of driving side electrodes arranged side by side, and
   a plurality of receiving side electrodes arranged side by side, the plurality of driving side electrodes being arranged in a predetermined relationship to the receiving side electrodes;
   a driving unit connected to said plurality of driving side electrodes and simultaneously applying drive signals to two neighboring ones of the driving side electrodes from one side of the driving side electrodes to the other side of the driving side electrodes, wherein a first drive signal of the drive signals has a time difference from a second drive signal of the drive signals, and the driving unit leaves other driving side electrodes to which the drive signals are not applied in a floating state; and a receiving unit connected to said plurality of the receiving side electrodes, and including a capacitor unit collecting electric charge based on the drive signal, the capacitor unit including a plurality of capacitor-switch circuits, each capacitor-switch circuit corresponding to a different one of the receiving side electrodes, said each capacitor-switch circuit including:

a first switch having a first terminal connected to an end of the corresponding one of the receiving side electrodes, a first capacitor having a first terminal connected to a second terminal of the first switch, a second capacitor having a first terminal connected to the second terminal of the first switch, a second switch having a first terminal connected to a second terminal of the first capacitor and a second terminal connected to a second terminal of the second capacitor, a third switch having a first terminal connected to the second terminal of the first switch, a third capacitor having a first terminal connected to a second terminal of the third switch, a fourth switch having a first terminal connected to the second terminal of the third switch and a second terminal connected to a second terminal of a first switch of a neighboring one of the receiving side electrodes, an extraction unit connected to a second terminal of the third capacitor and extracting a signal difference value between one of the receiving side electrodes to which the drive signal is applied and a neighboring one of the receiving side electrodes to which the drive signal is not applied, an amplification unit connected to an output of the extraction unit and amplifying the extracted difference value, an offset correction unit storing the amplified difference value and subtracting the amplified difference value for the first drive signal from the amplified difference value for the second drive signal, an accumulation unit connected to an output of the offset correction unit and accumulating and storing an output value from the offset correction unit, and a signal conversion unit connected to an output of the accumulation unit and converting an output value from the accumulation unit into a digital value.

7. The signal detection system according to claim 6, wherein the driving unit is configured to ground driving side electrodes adjacent to the driving side electrodes to which the drive signals are applied and to float the other driving side electrodes excluding the driving side electrodes to which the drive signals are applied or the grounded driving side electrodes.

8. The signal detection system according to claim 6, wherein the driving unit simultaneously applies the drive signal to opposite ends of a corresponding one of the driving side electrodes.

9. The signal detection system according to claim 6, wherein neighboring ones of the receiving side electrodes are combined into a group such that the receiving side electrodes are arranged in groups.

10. The signal detection system according to claim 6, wherein the capacitor unit and the extraction unit have a Miller capacitor structure.

11. The signal detection system according to claim 6, wherein the receiving unit further comprises a reset unit to reset each of the receiving side electrodes, the reset unit having a first terminal connected to the first terminal of the first switch and a second terminal connected to a ground.

* * * * *